(12) United States Patent
Obata et al.

(10) Patent No.: US 8,431,448 B2
(45) Date of Patent: Apr. 30, 2013

(54) ORGANIC TRANSISTOR ELEMENT, AND METHOD OF MANUFACTURING THE SAME BY CONCURRENTLY DOPING AN ORGANIC SEMICONDUCTOR LAYER AND WET ETCHING AN ELECTRODE PROVIDED ON THE ORGANIC SEMICONDUCTOR LAYER

(75) Inventors: Katsunari Obata, Tokyo (JP); Takuya Hata, Saitama (JP); Kenji Nakamura, Saitama (JP); Hiroyuki Endoh, Tokyo (JP)

(73) Assignee: Dai Nippon Printing Co., Ltd., Tokyo (JP)

( * ) Notice: Subject to any disclaimer, the term of this patent is extended or adjusted under 35 U.S.C. 154(b) by 662 days.

(21) Appl. No.: 12/448,563

(22) PCT Filed: Dec. 28, 2007

(86) PCT No.: PCT/JP2007/075294
§ 371 (c)(1),
(2), (4) Date: Jun. 25, 2009

(87) PCT Pub. No.: WO2008/081936
PCT Pub. Date: Jul. 10, 2008

(65) Prior Publication Data
US 2010/0090202 A1    Apr. 15, 2010

(30) Foreign Application Priority Data
Dec. 28, 2006    (JP) .................................. 2006-353760

(51) Int. Cl.
*H01L 21/00* (2006.01)

(52) U.S. Cl.
USPC ............ 438/151; 438/149; 438/158; 438/159

(58) Field of Classification Search .................... 257/40; 438/158, 159, 149, 151
See application file for complete search history.

(56) References Cited

U.S. PATENT DOCUMENTS
7,193,237 B2 * 3/2007 Aramaki et al. ................. 257/40
7,629,257 B2 * 12/2009 Klein et al. .................... 438/689
(Continued)

FOREIGN PATENT DOCUMENTS
| | | |
|---|---|---|
| JP | 2002-343578 A | 11/2002 |
| JP | 2003-324203 A | 11/2003 |
| JP | 2005-277204 A | 10/2005 |

OTHER PUBLICATIONS

K. Nakamura, "Fabrication of Vertical-type Organic Light-emitting Transistors," Extended Abstracts (The 66$^{th}$ Autumn Meeting), *Japan Society of Applied Physics*, No. 3, Sep. 7, 2005, p. 1177 (English translation enclosed).

(Continued)

*Primary Examiner* — David Vu
*Assistant Examiner* — Caleb Henry
(74) *Attorney, Agent, or Firm* — Posz Law Group, PLC

(57) ABSTRACT

In a method for manufacturing an organic transistor element, an electrode is subjected to wet etching into a predetermined pattern on an organic semiconductor layer. In the process for performing wet etching on the electrode so as to obtain a predetermined pattern, an etching liquid containing a dopant of the organic semiconductor layer is used to perform wet etching on the electrode and, simultaneously, the organic semiconductor layer is doped with the dopant.

12 Claims, 14 Drawing Sheets

U.S. PATENT DOCUMENTS

| | | |
|---|---|---|
| 7,754,548 B2 * | 7/2010 | Chae et al. .................... 438/161 |
| 2002/0167280 A1 * | 11/2002 | Hayashi et al. ............ 315/169.3 |
| 2005/0003590 A1 * | 1/2005 | Blees et al. .................. 438/151 |
| 2006/0022194 A1 * | 2/2006 | Nagayama ...................... 257/40 |
| 2006/0103290 A1 * | 5/2006 | Suh et al. ...................... 313/463 |
| 2009/0114619 A1 * | 5/2009 | Sotoaka et al. ................. 216/48 |
| 2009/0140270 A1 * | 6/2009 | Takahashi et al. .............. 257/88 |
| 2010/0019319 A1 * | 1/2010 | Hirai ............................. 257/347 |
| 2011/0212001 A1 * | 9/2011 | Ogawa et al. ............. 422/245.1 |

OTHER PUBLICATIONS

K. Kudo, "Recent Progress and Future Trend of Organic Transistors," Oyo Buturi: *Japan Society of Applied Physics*, vol. 72, No. 9 (2003), pp. 1151-1156 (Partial English translation enclosed; discussed on p. 3 of the Specification).

International Search Report mailed on Sep. Mar. 4, 2008 for the corresponding International patent application No. PCT/JP2007/075294 (English translation enclosed).

* cited by examiner

ORGANIC TRANSISTOR ELEMENT, AND METHOD OF MANUFACTURING THE SAME BY CONCURRENTLY DOPING AN ORGANIC SEMICONDUCTOR LAYER AND WET ETCHING AN ELECTRODE PROVIDED ON THE ORGANIC SEMICONDUCTOR LAYER

TECHNICAL FIELD

The present invention relates to an organic transistor element, a manufacturing method thereof, an organic light-emitting transistor, and a light-emitting display device. The present invention also relates, in more detail, to an organic transistor element, etc. manufactured by doping an organic semiconductor layer and concurrently by wet etching an electrode provided on the organic semiconductor layer.

BACKGROUND

Organic electroluminescence elements have a simple element structure, and therefore are expected as a light-emitting device for next-generation displays providing a smaller thickness, a lighter weight, a larger area, and lower costs. For this reason, active investigations are now being done in recent years.

Field effect transistors (FET) in an active matrix system using a thin-film transistor (TFT) are understood to be effective as a driving system for driving organic EL devices in terms of operational speed or power consumption. Alternatively, in recent years, active investigations on organic thin film transistors (organic TFT) using organic semiconductor materials are now being done for semiconductor materials that form thin-film transistors, in addition to investigations on inorganic semiconductor materials, such as silicon semiconductors and compound semiconductors, etc. Although such organic semiconductor materials are expected to be a next-generation semiconductor material, they have problems of exhibiting lower charge mobility and higher resistance compared with those of inorganic semiconductor materials.

On the other hand, in field effect transistors, static induction transistors (SIT) in a vertical FET structure have the advantages of shorter channel width of the transistor, higher speed response and more operating power owing to effective use of the whole surface of the electrode, while receiving little effect from the interface thereof, etc.

In recent years, organic light-emitting transistors based on a combination of the SIT structure and an organic EL device structure are now being investigated (see non-patent document 1 and patent documents 1 and 2) utilizing the above-mentioned feature of the static induction transistors (SIT). FIG. 13 illustrates a cross section block diagram of an example of an organic light-emitting transistor based on combination of the SIT structure and the organic EL device structure. This organic light-emitting transistor 101 has a vertical FET structure, as illustrated in FIG. 13, provided with a source electrode 103 having a transparent electric conductive film, a positive hole transporting layer 104 having a gate electrode 105 in a slit shape embedded therein, a light-emitting layer 106, and a drain electrode 107, arranged in this order on a glass substrate 102. The combined organic light-emitting transistor 101 has a structure with a Schottky gate electrode 105 in a slit shape, embedded in the positive hole transporting layer 104, and the positive hole transporting layer 104 and the gate electrode 105 are joined with a Schottky junction, thereby forming a depletion layer in the positive hole transporting layer 104. Since the spread of this depletion layer varies with the gate voltage, the channel width is controlled by variation of the gate voltage (voltage applied between the source electrode 103 and the gate electrode 105), and thereby the generated amount of charge is varied by control of the applied voltage between the source electrode 103 and the drain electrode 107.

In addition, FIG. 14 is a cross section block diagram illustrating an example of an organic light-emitting transistor based on combination of a bottom contact type FET structure and an organic EL device structure described in patent document 2. This organic light-emitting transistor 111 has a structure, wherein an auxiliary electrode 113 and an insulating layer 118 are laminated on a substrate 112, an anode 115 is formed on the insulating layer 118, a light-emitting material layer 116 is formed so as to cover the anode 115 on the insulating layer, and furthermore a cathode 117 is formed thereon, as illustrated in FIG. 14. An anode buffer layer 119 is formed on the anode 115 for passing a positive hole from the anode 115 to the light-emitting material layer 116 and simultaneously for preventing an electron passing from the light-emitting material layer 116 to the anode 115. Also in this organic light-emitting transistor 111, the channel width is controlled by variation of the applied voltage between the auxiliary electrode 113 and the anode 115, and the generated amount of the charge is varied by control of the applied voltage between the anode 115 and the cathode 117.

[Non-patent document 1]: Kazuhiro Kudo "The present circumstances and future view of organic transistors", Oyo Butsuri, the 72nd volume, No. 9, pages 1151 to 1156 (2003)

[Patent document 1]: Japanese laid-open application No. 2003-324203 (Claim 1)

[Patent document 2]: Japanese laid-open application No. 2002-343578 (FIG. 23)

DESCRIPTION OF THE INVENTION

Problem to be Solved by the Invention

Investigations are now being carried out for higher carrier mobility in transistors using organic semiconductor materials (also referred to as organic FET), and the mobility is greatly dependent on element structures or manufacturing processes. For example, the element structure of the organic FET is roughly divided into a top contact type and a bottom contact type, based on the physical spatial relationship between the source drain electrode and the organic semiconductor layer. Generally, the top contact type element demonstrates carrier mobility higher than that of the element of the bottom contact type. Therefore, investigations on the organic top contact type FET are often performed. In forming a pattern of a source drain electrode on an organic semiconductor layer by wet etching methods, which did not cause large problems in inorganic semiconductors, etching damage and etchant contamination to the organic semiconductor were induced, resulting in reduction of carrier mobility in the organic semiconductor layer. For this reason, conventionally, the pattern formation is not performed by the wet etching method in this organic top contact type FET, but is performed by the mask deposition method.

On one hand, however, the position control of a shadow mask to be used in pattern formation by the mask deposition method in the organic top contact type FET is a complicated operation. Simultaneously, the dimensional accuracy and precision of the shadow mask can not reach the dimensional accuracy and precision demanded in formation of electrode patterns having higher accuracy and precision, to cause variations in the dimensions of the electrode obtained by the pattern formation, providing resultant variation in transistor characteristics. In addition, use of shadow masks having a large area also causes a problem of providing waviness in the shadow mask used in the organic FETs for a display panel with a large area, in recent years.

On the other hand, since a source drain electrode is formed on a gate insulating film, while having a problem of the above-described carrier mobility in the organic FET of bottom contact type, the FET may be formed with high accuracy and precision by a micro-fabrication process, such as the wet etching methods, and then the organic semiconductor layer is formed thereon, leading to the benefits of advantageous high-density integration.

Furthermore, in the organic light-emitting transistor combining the SIT structure and the organic EL device structure described in the above-described non-patent document 1 and patent documents 1 and 2, described with reference to FIG. 14, application of a fixed voltage ($-V_{d1}<0$) between the anode 115 and the cathode 117 generates many positive holes on the plane of the anode 115 facing the cathode 117. Then the positive hole generated thereby causes a flow of charge (positive hole) facing the cathode 117. Here, application of a voltage of $V_d = -V_d \ll -V_{d1}$ between the anode 115 and the cathode 117 in order to obtain a larger flow of charge (that is, in order to obtain a higher luminance) will cause a dominant occurrence of generation and flow of charge between the anode 115 and the cathode 117. Therefore, a problem occurs that the generated amount of the charge cannot be controlled and furthermore the control of the light emission quantity becomes difficult, even with the help of the control of the applied voltage ($V_g$) between the auxiliary electrode 113 and the anode 115.

The present invention has been completed in order to solve the above-described problems, and it aims at providing a method for manufacturing an organic transistor element that provides pattern formation with high accuracy and precision of an electrode and achievement of high-density integration on an organic semiconductor layer, in manufacturing of organic top contact type FETs having a structure that provides high carrier mobility, and that demonstrates outstanding physical properties. Also the present invention aims at providing a method for manufacturing a light-emitting type organic transistor element that enables easy electric current control between the anode and the cathode.

Another object of the present invention is to provide an organic transistor element and a light-emitting type organic transistor element that achieve high-density integration and outstanding physical properties. Still another object is to provide an organic light-emitting transistor and a light-emitting display device.

Means for Solving the Problem

In the course of repeated investigations on organic top contact type FETs having source-drain electrodes provided on an organic semiconductor layer, the present inventors have found out that a design of components included in an etching solution can avoid etching damage and etchant contamination to the organic semiconductor, and further can improve carrier mobility, leading to completion of the present invention.

That is, in order to solve the above-described problems, the present invention is a method for manufacturing an organic transistor element having an electrode provided above an organic semiconductor layer or a pair of electrodes that sandwiches the organic semiconductor layer by wet etching into a predetermined pattern, wherein in a process of performing wet etching of the electrode into the predetermined pattern, an etching solution includes a dopant for the organic semiconductor layer, and the dopant is doped into the organic semiconductor layer with concurrent wet etching of the electrode being performed using the etching solution.

In the present invention, the etching solution includes the dopant for the organic semiconductor layer and the dopant is doped into the organic semiconductor layer with concurrent wet etching of the electrode being performed using the etching solution in the process of performing wet etching of the electrode into a predetermined pattern. Therefore the present invention can achieve the following:
  (i) highly accurate and precise pattern formation of electrodes and high-density integration may be obtained by the wet etching method;
  (ii) deterioration of the carrier mobility in the organic semiconductor layer may be suppressed or the carrier mobility improves while avoiding the etching damage and the etchant contamination to the organic semiconductor layer; and
  (iii) simultaneous execution of highly accurate and precise etching of the electrode, and of doping into the organic semiconductor layer becomes possible, leading to an operational effect of efficient manufacturing.

Furthermore, A method for manufacturing an organic transistor element, at least comprises: preparing a substrate having an auxiliary electrode and an insulating layer provided in this order; providing an organic semiconductor layer on the insulating layer; providing a first electrode layer above the organic semiconductor layer or providing a pair of first electrode layers that sandwiches the organic semiconductor layer; providing a charge injection suppressing layer with a predetermined dimension on the first electrode layer or the pair of first electrode layers; wet etching the first electrode layer or the pair of first electrode layers using the charge injection suppressing layer as an etching mask to provide a first electrodes having a predetermined pattern; providing a light-emitting layer on the charge injection suppressing layer and the organic semiconductor layer; and providing a second electrode on the light-emitting layer, wherein in a process of providing the first electrode having the predetermined pattern, an etching solution includes a dopant for the organic semiconductor layer, and the dopant is doped into the organic semiconductor layer with concurrent wet etching of the first electrode layer being performed using the etching solution.

In the light-emitting type organic transistor elements produced by this method, a fixed voltage is applied between the first electrode and the second electrode, and simultaneously a variable voltage is applied between the auxiliary electrode and the first electrode to control the light emission quantity. Also in the present invention, in the same manner as that in the above-described organic transistor element, since an etching solution includes a dopant for the organic semiconductor layer, and the dopant is doped into the organic semiconductor layer with wet etching of the electrode being performed concurrently using the etching solution in the process of wet etching of an electrode having a predetermined pattern, the following operational effects result:
  (i) highly accurate and precise pattern formation of electrodes by the wet etching method and high-density integration may be obtained;
  (ii) deterioration of the carrier mobility in the organic semiconductor layer may be suppressed or the carrier mobility improves while avoiding the etching damage and the etchant contamination to the organic semiconductor layer;
  (iii) concurrent execution of highly accurate and precise etching of the electrode and doping into the organic semiconductor layer becomes possible, may be achieved, leading to operational effect of efficient manufacturing.

Furthermore, in the present invention, disposition of the charge injection suppressing layer with a predetermined dimension on the first electrode can suppress generation of a charge (positive hole or electron) in the upper surface of the first electrode and simultaneously can suppress flow of the charge to the second electrode, in the case of applying a fixed voltage between the first electrode and the second electrode of the manufactured light-emitting type organic transistor element. Since a charge in the first electrode is generated on both end faces with a small area that does not have the charge injection suppressing layer provided thereon and the generated charge is efficiently injected into the charge injecting layer in contact with both ends, and the charge will go to the second electrode, the current value between the first electrode and—the second electrode can be suppressed, in the case of applying the fixed voltage between the first electrode and the second electrode. As a result, control of the voltage applied between the auxiliary electrode and the first electrode can control the electric current that flows between the first electrode and the second electrode, allowing resultant control of the light emission quantity.

In the method for manufacturing the organic transistor element of the present invention, or the pair of first electrode layers In the present invention, since the dopant oxidizes or reduces the organic semiconductor layer, the number of positive holes will increase in the oxidized organic semiconductor layer, and electrons will increase in the reduced organic semiconductor layer, resulting in an increase of the carrier density in the organic semiconductor layer and in reduction of the resistance of the organic semiconductor layer. Here, oxidation of the organic semiconductor layer may be performed by doping with a dopant having oxidative capability, and reduction of the organic semiconductor layer may be performed by doping with a dopant having reductive capability.

In the method for manufacturing the organic transistor element of the present invention, the organic semiconductor layer is an organic layer including a charge injecting material, a charge transporting material, or a light-emitting material.

In the present invention, when the organic semiconductor layer is manufactured as an organic layer including the charge injecting material, the charge transporting material, or the light-emitting material, the organic top contact type FET having electrodes formed on an organic semiconductor layer thereof may be manufactured as various functional devices.

The organic transistor element of the present invention for solving the above-described problems is an organic transistor element having an organic semiconductor layer provided on a substrate, and a source-drain electrode provided into a predetermined pattern above the organic semiconductor layer or a source-drain electrode provided into a predetermined pattern above the organic semiconductor layer or a pair of source-drain electrodes that sandwiches the organic semiconductor layer, the dopant being doped at least to a surface layer of the organic semiconductor layer with concurrent etching of the source-drain electrode using the etching solution.

In the present invention, the source-drain electrode is provided by etching with an etching solution including the dopant for the organic semiconductor layer and the dopant is doped at least to the surface layer (the surface layer on a side that touches the source-drain electrode) of the organic semiconductor layer with concurrent etching of the source-drain electrode being performed using the etching solution. Therefore, the organic transistor element that is obtained can achieve that the following:
  (i) it has a source-drain electrode with a highly accurate and precise pattern formation to achieve high-density integration; and
  (ii) it has an organic semiconductor layer where the reduction of the carrier mobility may be suppressed, or the carrier mobility may be improved, providing an operational effect of excellent transistor characteristics.

Furthermore, the light-emitting type organic transistor element of the present invention for solving the above-described problems is an organic transistor element, comprising: a substrate; an auxiliary electrode provided on the substrate; an insulating layer provided on the auxiliary electrode; an organic semiconductor layer provided on the insulating layer; a first electrode provided, into a predetermined pattern, above the organic semiconductor layer or a pair of first electrodes that sandwiches the organic semiconductor layer; a charge injection suppressing layer provided on the first electrode with a predetermined dimension; a light-emitting layer provided on the charge injection suppressing layer and the organic semiconductor layer; and a second electrode provided on the light-emitting layer, wherein the first electrode is provided by etching with an etching solution including a dopant for the organic semiconductor layer, the dopant being doped at least to the surface layer of the organic semiconductor layer with concurrent etching of the first electrode being performed using the etching solution.

In this light-emitting type organic transistor element, a variable voltage is applied between the auxiliary electrode and the first electrode to control the light emission quantity, while a fixed voltage is applied between the first electrode and the second electrode. Also in the organic transistor element of the present invention, the first electrode is provided by etching the organic semiconductor layer with an etching solution including the dopant, and the dopant is doped at least to a surface layer (the surface layer on a side that touches the first electrode) of the organic semiconductor layers with concurrent etching of the first electrode being performed using the etching solution. Therefore, this light-emitting type organic transistor element can achieve that the following:
  (i) it has a source-drain electrode with highly accurate and precise pattern formation and achieves high-density integration; and
  (ii) it has an organic semiconductor layer where the reduction of the carrier mobility may be suppressed, or the carrier mobility may be improved, providing the operational effects of excellent transistor characteristics.

Furthermore, in the present invention, since the charge injection suppressing layer with a predetermined dimension is provided on the first electrode, generation of a charge (positive hole or electron) in the upper surface of the first electrode may be suppressed, and simultaneously the flow of the charge flowing to the second electrode may also be suppressed. The charge to be generated in the first electrode is generated on both end faces with a small area devoid of the charge injection suppressing layer provided thereon, and then the generated charge is efficiently injected into the charge injecting layer in contact with both ends to flow to the second electrode, when a fixed voltage is applied between the first electrode and the second electrode. Therefore the current value between the first electrode and the second electrode may be suppressed in the case of applying a fixed voltage between the first electrode and the second electrode. As a result, control of a voltage to be applied between the auxiliary electrode and the first electrode can control the electric current that flows between the first electrode and the second electrode, leading to control of the light emission quantity.

The surface layer of the organic transistor element according to the present invention is the surface layer is oxidized or reduced.

In the present invention, since the surface layer of the organic semiconductor layer is oxidized or reduced by the dopant, positive holes increase in the oxidized surface layer, and electrons increase in the reduced surface layer, resulting in an increase of the carrier density in the organic semiconductor layer and reduction of resistance of the organic semiconductor layer. Here, oxidation of the organic semiconductor layer may be performed by doping with a dopant having oxidative capability, and reduction of the organic semiconductor layer may be performed by doping with a dopant having reductive capability.

In the organic transistor element of the present invention, the organic semiconductor layer is an organic layer including a charge injecting material, a charge transporting material, or a light-emitting material.

According to the present invention, when an organic semiconductor layer is manufactured as an organic layer including a charge injecting material, a charge transporting material, or a light-emitting material, the organic top contact type FET having an electrode to be formed on the organic semiconductor layer may be used as various functional devices.

Furthermore, the organic light-emitting transistor of the present invention for solving the above-described problems comprises the organic transistor element of the present invention; a first voltage supply device for applying a fixed voltage between the first electrode and the second electrode of the organic transistor element; and a second voltage supply device for applying a variable voltage between the first electrode and an auxiliary electrode of the organic transistor element.

Since the present invention has a light-emitting type organic transistor element of the present invention and simultaneously has the first voltage supply device and the second voltage supply device, a fixed voltage may be applied between the first electrode and the second electrode and simultaneously a variable voltage may be applied between the first electrode and the auxiliary electrode. As a result, high-density integration may be achieved, and simultaneously a charge quantity may be sharply varied, using a controlled voltage, with respect to the light-emitting type organic transistor element that exhibits excellent transistor characteristics to control the electric current flowing between the first electrode and the second electrode, resulting in control of light emission quantity.

Furthermore, the light-emitting display device of the present invention for solving the above-described problem is a light-emitting display device having a plurality of light-emitting parts disposed therein in a matrix, each of the plurality of light-emitting parts having the organic transistor element of the present invention.

The present invention can achieve high-density integration, and can provide a light-emitting display device with large area using a light-emitting type organic transistor element of the present invention having excellent physical properties.

EFFECT OF THE INVENTION

Use of the organic transistor element of the present invention and the method for manufacturing the same, and the light-emitting type organic transistor and the method for manufacturing the same has the following effects:

(i) highly accurate and precise pattern formation of electrodes by the wet etching method and high-density integration may be obtained;

(ii) deterioration of the carrier mobility in the organic semiconductor layer may be suppressed or the carrier mobility improves while avoiding the etching damage and the etchant contamination to the organic semiconductor layer; and (iii) simultaneous execution of highly accurate and precise etching of the electrode, and of doping into the organic semiconductor layer becomes possible, leading to the operational effect of efficient manufacturing. Furthermore, when the organic semiconductor layer is manufactured as an organic layer including a charge transporting material, or a light-emitting material, the organic top contact type FET having a source-drain electrode to be formed on the organic semiconductor layer may be manufactured and used as various functional devices. Especially in the present invention, since positive holes will increase in number in the organic semiconductor layer oxidized by the dopant, and electrons will increase in the reduced organic semiconductor layer reduced by the dopant, resulting in an increase of the carrier density in the organic semiconductor layer and a reduction of the resistance of the organic semiconductor layer.

Furthermore, the organic light-emitting transistor of the present invention allows application of a fixed voltage between the first electrode and the second electrode, and also application of a variable voltage between the first electrode and auxiliary electrode. As a result, high-density integration may be achieved, and simultaneously a charge quantity may be sharply varied, using a controlled voltage, with respect to the light-emitting type organic transistor element that exhibits excellent transistor characteristics to control the electric current flowing between the first electrode and the second electrode, resulting in control of light emission quantity. In this way, oxidation or reduction of the organic semiconductor layer increases positive holes or electrons in the organic semiconductor layer. As a result, the carrier density of the organic semiconductor layer rises and the resistance drops, as described above, in current control performed by the application of a variable voltage between the first electrode and the auxiliary electrode, variation of the gate voltage to be applied between the electrodes enables control of movement of the carrier.

Furthermore, use of the light-emitting display device of the present invention can achieve high-density integration, and can provide a light-emitting display device with a large area having the light-emitting type organic transistor element of the present invention having outstanding physical properties.

The present invention enables highly accurate and precise pattern formation of electrodes on the organic semiconductor layer and can achieve high-density integration in the manufacturing of organic top contact type FETs that give high carrier mobility based on the structure thereof. The present invention also provides the method for manufacturing the organic transistor element having outstanding physical properties, and the method for manufacturing the organic field effect type light-emitting transistor element, allowing easier current control between the anode and the cathode, and having an organic EL device structure and a vertical FET structure. And furthermore, the present invention provides the organic transistor element and the light-emitting type organic transistor element that can achieve high-density integration and exhibit outstanding physical properties, and also provides the organic light-emitting transistor and the light-emitting display device.

BEST MODE FOR CARRYING OUT OF THE INVENTION

Hereinafter, the organic transistor element, the manufacturing method thereof, the organic light-emitting transistor, and the light-emitting display device of the present invention will be described with reference to the drawings. The present invention, however, is not limited to following embodiments, and may be implemented with various modifications within the scope of the object.

[Method for Manufacturing the Organic Transistor Element]

Initially, the method for manufacturing the organic transistor element of the present invention will be described. FIGS. 1A-1G are process flows illustrating examples of the method for manufacturing the organic transistor element of the present invention. As illustrated in FIGS. 1A-1G, the method for manufacturing the organic transistor element of the present invention is a method for manufacturing the organic transistor element 10 having electrodes 15s and 15d provided by wet etching a predetermined pattern above/onto an organic semiconductor layer 14 or in a manner of sandwiching the organic semiconductor layer 14, the method having a special feature that an etching solution includes a dopant for the organic semiconductor layer 14 in a process of performing wet etching of the electrodes 15s and 15d into a predetermined pattern, and the dopant is doped to the organic semiconductor layer 14 with concurrent wet etching of the electrodes 15s and 15d being performed using the etching solution. Hereinafter, configuration of the manufacturing method of the present invention and the obtained organic transistor element will be described in the order of processes in FIGS. 1A-1G.

Figure 1:
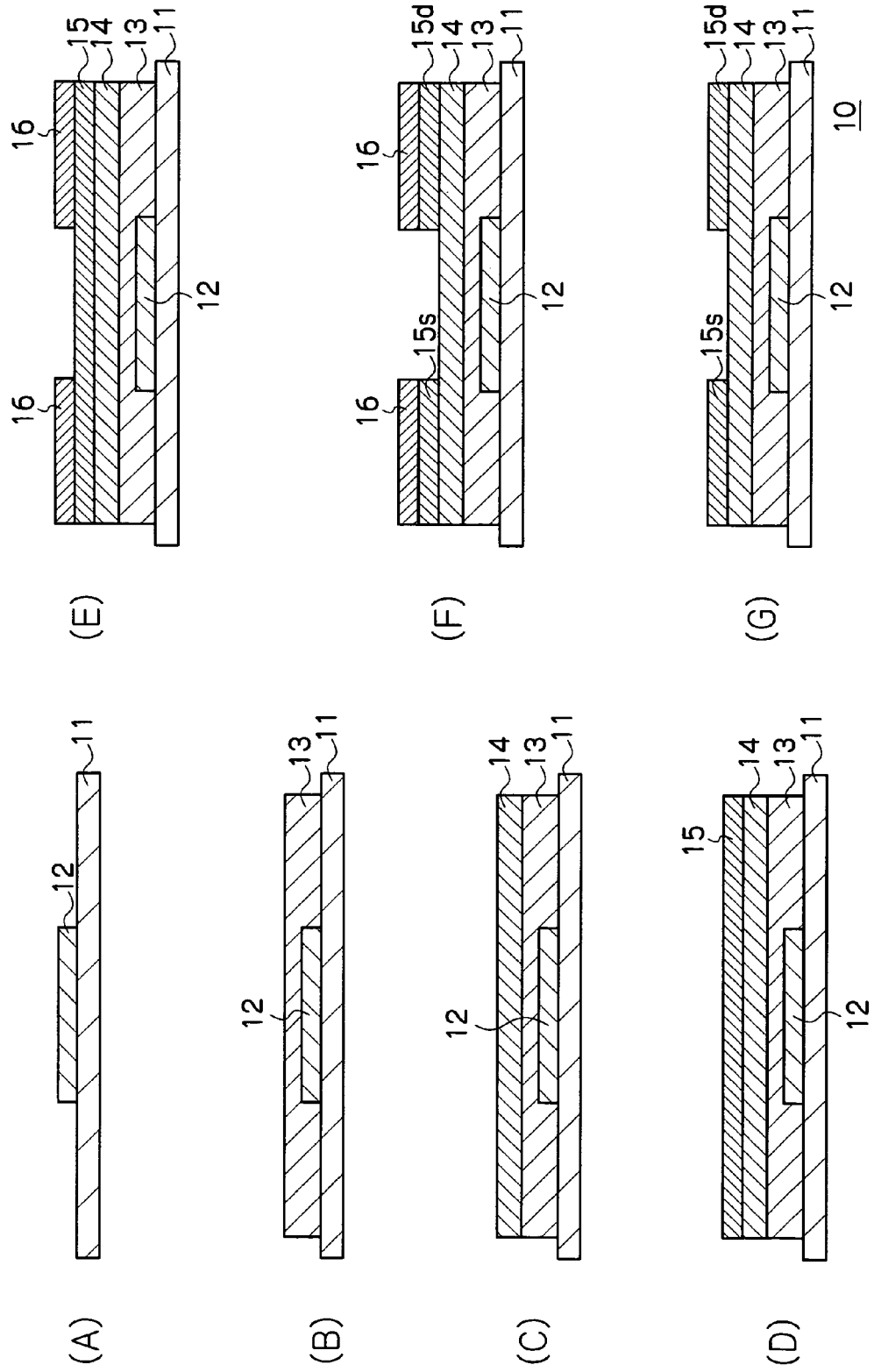
FIGS. 1A-1G are process flows illustrating examples of the method for manufacturing the organic transistor element of the present invention.

FIG. 1A illustrates a process of forming a gate electrode 12 on a substrate 11. The substrate 11 is not in particular limited, and may be suitably selected based on the materials of each layer to be laminated thereon. For example, materials including various kinds of substances, such as metals of Al, glasses, quartz, or resins, may be used. The substrate 11 may be transparent, may be semi-transparent, or may be opaque, and may be selected based on objectives.

The gate electrode 12 is provided in a predetermined pattern on the substrate 11, and for example, materials, such as metals, conductive oxides, and conductive polymers may be used for the gate electrode. In detail, the examples include: transparent electric conductive films, such as ITO (indium tin oxide), indium oxide, IZO (indium zinc oxide), $SnO_2$, and ZnO; metals having a large work functions, such as gold and chromium; common metals, such as Al and Ag; conductive polymers, such as derivatives of polyanilines, polyacethylenes, and polyalkyl thiophenes, and derivatives of polysilanes etc. The gate electrode 12 is provided on the substrate 11, and a barrier layer, a smoothening layer (neither illustrated), etc. may be provided between the substrate 11 and the gate electrode 12.

The gate electrode 12 may be an electrode having a single layer structure formed with the above-described electrode material, and may be an electrode having a laminated structure formed with a plurality of electrode materials. The gate electrode 12 is formed by vacuum processes or coatings of vacuum deposition, sputtering, CVD, etc. The thickness thereof is dependent on the materials etc. to be used, and, for example, it is preferably approximately 10 nm to 1000 nm. Patterning methods of the gate electrode 12 are not in particular limited, but include, for example:

(i) a mask deposition method that directly forms the gate electrode 12 in a predetermined pattern on the substrate 11 by vacuum deposition etc. performed using a mask provided thereon;

(ii) a photoresist method, wherein photoresist processing is performed, after formation of a gate electrode material in layers on the substrate 11, to form a resist layer in a predetermined pattern, and then the gate electrode 12 is formed in a predetermined pattern on the substrate 11 by dry etching or wet etching of an exposed electrode material; and (iii) an coating method wherein the gate electrode 12 is directly formed in a predetermined pattern on the substrate 11 by methods, such as an ink jet of a coating type of electrode material etc.

FIG. 1B is a process of providing an insulating layer 13 so as to cover the gate electrode 12 on the substrate 11. The insulating layer 13 is provided on the gate electrode 12, and may be formed using: inorganic materials, such as $SiO_2$, $SiN_x$, and $Al_2O_3$; organic materials, such as polychloro pyrene, polyethylene terephthalate, polyoxymethylene, polyvinyl chloride, polyvinylidene fluoride, cyanoethyl pullulan, polymethylmethacrylate, polyvinylphenol, poly sulfone polycarbonate, and polyimide; and resist materials that are generally available in the market. The insulating layer 13 may be an insulating layer with a single layer structure formed with the above-described material, and may be an insulating layer with a laminated structure formed with a plurality of materials.

Especially in the present invention, from viewpoints of manufacturing cost or manufacturing ease, generally used resist materials may preferably be used, and the insulating layer 13 may be formed into a predetermined pattern using a screen printing method, a spin coat method, a cast method, a dip coating method, a transfer method, an ink jet method, etc. and a photolithograph method. Here, the insulating layer 13 including the above-described inorganic material may be formed using existing pattern processes, such as a CVD method. The smaller thickness of the insulating layer 13 will give the better performance. Since an excessively small thickness thereof has a tendency to increase a leakage current between the gate electrode 12 and source-drain electrodes 15s and 15d, usually the thickness is preferably approximately 0.001 μm to 5.0 μm.

FIG. 1C is a process of providing the organic semiconductor layer 14 on the insulating layer 13. The organic semiconductor layer 14 is provided on the insulating layer 13, and can be formed by a vacuum deposition method, a spin coat method, etc., using organic semiconductor materials, such as pentacene and polythiophene. This organic semiconductor layer 14 may have a single layer structure, and may have a laminated structure formed with a plurality of materials. Usually, the thickness of the organic semiconductor layer 14 is preferably approximately 10 nm to 500 nm.

FIG. 1D is a process of providing the electrode layer 15 on the organic semiconductor layer 14. This electrode layer 15 provides the source electrode 15s and the drain electrode 15d after being patterned in layers on the insulating layer 13. Electrode materials similar to those of the gate electrode 12 may be mentioned as an electrode layer material, the material being a metal that forms an ohmic contact with respect to the component of the organic semiconductor layer 14 which the electrode layer 15 contacts. Examples preferably include: metals having a large work function, such as gold and chromium; transparent electric conductive films, such as ITO (indium tin oxide), indium oxide, IZO (indium zinc oxide), $SnO_2$, and ZnO; conductive polymers, such as derivatives of polyanilines, polyacetylenes, and polyalkyl thiophenes, and derivatives of polysilanes etc. Especially, vapor deposited films or sputtered films, such as Au, Ag, Al, ZnS, ZnSe, advantageously do not damage the organic semiconductor layer 14 in film formation.

This electrode layer 15 may be directly provided on the organic semiconductor layer 14, and may preferably be provided through layers, such as a charge injecting layer, above/on the organic semiconductor layer 14 from a viewpoint of charge injection efficiency. Here, a protective layer (not illustrated) for reduction of damage to be added to the organic semiconductor layer 14 in electrode layer formation may be provided to a position on the organic semiconductor layers 14, except for a position to be necessarily contacted to the electrode layer 15.

The electrode layer 15 may be an electrode with a single layer structure formed with the electrode material, and may be an electrode with a laminated structure formed with a plurality of electrode materials. The electrode layer 15 is formed by vacuum processes, such as vacuum deposition, sputtering, and CVD, or by coating. The thickness is dependent on the materials to be used, and for example, it is preferably approximately 10 nm to 1000 nm.

FIG. 1E is a process of forming the etching mask 16 in a predetermined pattern on the electrode layer 15. As the etching mask 16, inorganic insulating films and organic insulating films may be mentioned. Examples of materials for forming the inorganic insulating film include, for example, inorganic insulating material, such as $SiO_2$, $SiN_x$, and $Al_2O_3$. Examples of materials for forming the organic insulating film include, for example, polychloroprene, polyethylene terephthalates, polyoxymethylenes, polyvinyl chlorides, polyvinylidene fluorides, cyanoethyl pullulans, polymethylmethacrylates, polyvinylphenols, polysulfones, polycarbonates, polyimides, etc. This etching mask 16 may have a single layer structure, or may have a laminated structure. The etching mask 16 is formed by vacuum processes, such as vacuum deposition, sputtering, and CVD, or by coating. The thickness is dependent on the material to be used, and for example, it is preferably approximately 0.001 μm to 10 μm.

In the present invention, it is preferred to form the etching mask 16 using insulating materials having easy availability, excellent film formation, and patterning with excellent accuracy and precision. Especially, films including photosensitive materials that allow removal by light irradiation, and in more detail resist films of positive type or negative type are preferred. Of the films described above, in the case of use of the positive type photosensitive material, easy removal of only the exposed positive type photosensitive material may be performed with excellent dimensional accuracy and precision, by exposure using a mask after providing the photosensitive material on the electrode layer 15. The etching mask 16 should just be formed with a dimension that allows etching of the electrode layer 15 into the predetermined pattern.

FIG. 1F is a process of performing wet etching of the electrode layer 15 into a predetermined pattern. In the present invention, the etching solution used for the wet etching includes a dopant for the organic semiconductor layer 14. Wet etching of the electrode layer 15 by such an etching solution enables patterning of the source-drain electrodes 15s and 15d above/on the organic semiconductor layer 14 or in a manner of sandwiching the organic semiconductor layer 14. In the present invention, since the dopant is doped to the organic semiconductor layer 14 with concurrent wet etching of the source-drain electrodes 15s and 15d being performed using the etching solution, the following effects may be attained:

(i) highly accurate and precise pattern formation of the source-drain electrodes 15s and 15d by the wet etching method and high-density integration may be obtained;

(ii) deterioration of the carrier mobility in the organic semiconductor layer 14 may be suppressed or the carrier mobility improves while avoiding the etching damage and the etchant contamination to the organic semiconductor layer 14; and (iii) simultaneous execution of highly accurate and precise etching of the source-drain electrodes 15s and 15d, and doping into the organic semiconductor layer 14 becomes possible, leading to an operational effect of efficient manufacturing.

In the present invention, the dopant included in the etching solution oxidizes or reduces the organic semiconductor layer 14 simultaneously in etching. Some of the dopants have oxidative capability, and others have reductive capability. On one hand, etching by an etching solution including a dopant having oxidative capability oxidizes the organic semiconductor layer 14 to increase positive holes. On the other hand, etching by an etching solution including a dopant having reductive capability reduces the organic semiconductor layer 14 to increase electrons. In either case, the carrier density in the organic semiconductor layer 14 rises and the resistance of the organic semiconductor layer 14 will be lowered.

As an etching solution to be used, a suitable etching solution is selected according to the kind of the organic semiconductor layer 14, and, for example, etching solutions, such as a mixed acid (mixed solution of hydrochloric acid and sulfuric acid etc.) and an iodine solution may be mentioned. Here, a suitable dopant may be selected according to the kind of the organic semiconductor layer 14 to act as a doping partner, as a dopant for etching solution to be included, and for example, examples of the dopant include: acids, such as hydrochloric acid, sulfuric acid, and sulfonic acid; Lewis acids, such as $PF_6$, $AsF_5$, and $FeCl_3$; halogen atoms, such as iodine; sodium; potassium, etc.

In the Examples to be described later, an iodine etching solution including iodine as a dopant having oxidative capability is used on the organic semiconductor layer 14, including thiophene derived high polymer, and other examples include, for example: halogens, such as $Cl_2$, $Br_2$, $I_2$, $ICl$, $ICl_3$, $IBr$, and $IF$; Lewis acids, such as $PF_5$, $AsF_5$, $SbF_5$, $BF_3$, $BCl_3$, $BBr_3$, and $SO_3$; proton acids, such as $HF$, $HCl$, $HNO_3$, $H_2SO_4$, $HClO_4$, $FSO_3H$, $ClSO_3H$, and $CF_3SO_3H$; organic acids, such as acetic acid, formic acid, and amino acid; transition metal compounds, such as $FeCl_3$, $FeOCl$, $TiCl_4$, $ZrCl_4$, $HfCl_4$, $NbF_5$, $NbCl_5$, $TaCl_5$, $MoCl_5$, $WF_5$, $WCl_6$, $UF_6$, and $LnCl_3$ (Ln=lanthanoids, such as La, Ce, Nd, and Pr, and Y); electrolytic anions, such as $Cl^-$, $Br^-$, $I^-$, $ClO_4^-$, $PF_6^-$, $AsF_5^-$, $SbF_6^-$, $BF_4^-$, and sulfonate anions etc. In addition, examples of dopants having reductive capability include; alkali metals, such as Li, Na, K, Rb, and Cs; alkaline earth metals, such as Ca, Sr, and Ba; rare earth metals, such as Y, La, Ce, Pr, Nd, Sm, Eu, Gd, Tb, Dy, Ho, Er, and Yb; ammonium ion, alkyl group, such as $R_4P^+$, $R_4As^+$, $R_3S^+$, acetylcholine, etc.

Here, the source-drain electrodes 15s and 15d formed by etching may have, for example, a comb-type pattern having a line width of approximately 1 μm to 500 μm and a line pitch of approximately 1 μm to 500 μm; or a grid-type pattern having a grid width of approximately 1 μm to 500 μm and a grid pitch of approximately 1 μm to 500 μm. However, the pattern is limited to neither to the comb type pattern nor the grid type pattern, and it may be formed into various kinds of patterns, such as a lozenge and a round shape. Furthermore, the line width or the pitch is not in particular limited, either, and furthermore each line width or pitch does not need to have the same value as each other.

Finally, as illustrated in FIG. 1G, the etching mask 16 in the predetermined pattern is optionally removed, if necessary. When the etching mask 16 is not removed, the etching mask 16 may act as an insulating layer for the electrode (source-drain electrode) in integration of the obtained organic transistor element 10. In removal of the etching mask 16, media that damage neither the organic semiconductor layer 14 nor the source-drain electrodes 15s and 15d are used. For example, dry etching methods etc. are used in the case of the etching mask 16 of an inorganic insulating film, and liquids having solubility relative to the organic insulating film (for example, developing solutions and releasing liquids, in case of photoresist) etc. are used, in the case of the etching mask 16 of an organic insulating film.

As illustrated in FIG. 1G, the organic transistor element 10 thus obtained is an organic top contact type FET element, and it has at least the substrate 11; the gate electrode 12 provided on the substrate 11; the insulating layer 13 provided so as to cover the gate electrode 12; the organic semiconductor layer 14 provided on the insulating layer 13; and the source-drain electrodes 15s and 15d provided by pattern formation on the organic semiconductor layer 14.

[Method for Manufacturing a Light-Emitting Type Organic Transistor Element]

Figure 2:
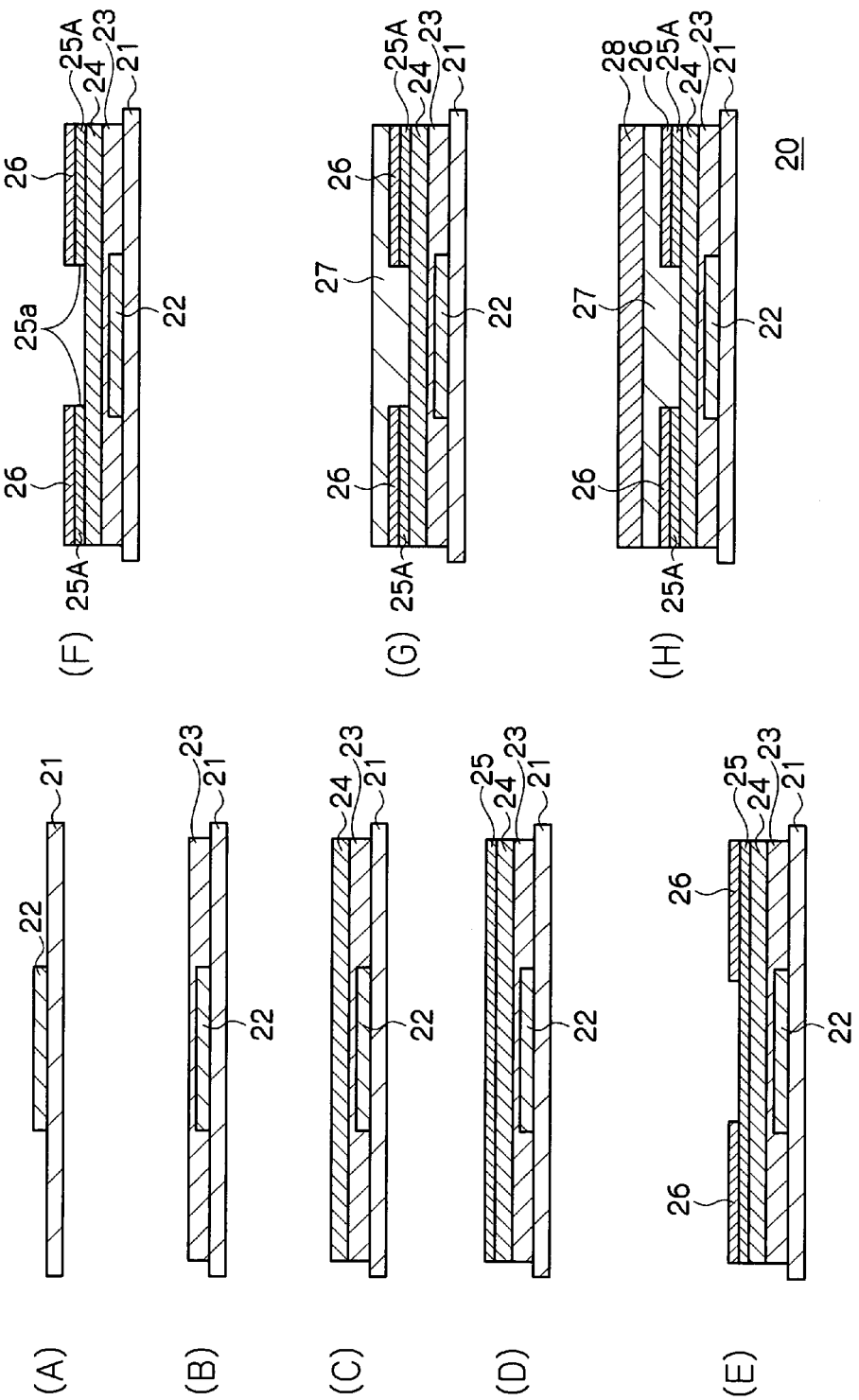
FIGS. 2A-2H are process flows illustrating examples of the method for manufacturing the light-emitting type organic transistor element of the present invention.

Next, the method for manufacturing a light-emitting type organic transistor element will be described. FIG. 2 is a process flow illustrating an example of the method for manufacturing the light-emitting type organic transistor element of the present invention. A large difference between this light-emitting type organic transistor element 20 and the organic transistor element obtained by the method of FIGS. 1A-1G is that a gate electrode 12 works as an auxiliary electrode 22, source-drain electrodes 15s and 15d work as a first electrode 25A, and simultaneously it has a charge injection suppressing layer 26, a light-emitting layer 27, and a second electrode 28.

That is, the method for manufacturing the light-emitting type organic transistor element 20 illustrated in FIGS. 2A-2H at least comprises: preparing a substrate 21 having the auxiliary electrode 22 and an insulating layer 23 provided in this order; providing an organic semiconductor layer 24 on the insulating layer 23; providing the first electrode layer 25 above/on the organic semiconductor layer 24 or in a manner of sandwiching the organic semiconductor layer 24; providing a charge injection suppressing layer 26 with a predetermined dimension on the first electrode layer 25; wet etching the first electrode layer 25 using the charge injection suppressing layer 26 as an etching mask to provide the first electrode 25A having a predetermined pattern; providing a light-emitting layer 27s on the charge injection suppressing layer 26 and the organic semiconductor layer 24; and providing a second electrode 28 on the light-emitting layer 27, wherein an etching solution includes a dopant for the organic semiconductor layer 24, and the dopant is doped into the organic semiconductor layer 24 with concurrent wet etching of the first electrode layer 25 being performed using the etching solution, in providing the first electrode 25A having the predetermined pattern. Hereinafter, the manufacturing method according to the present invention and the configuration of the obtained light-emitting type organic transistor element will be described in the order of the processes in FIGS. 2A-2H. Here, points in the description which overlap with the description of FIGS. 1A-1G will suitably be omitted.

FIG. 2A is a process of forming the auxiliary electrode 22 on the substrate 21. Since the substrate 21 is similar to the substrate 11 illustrated in FIG. 1A, the description will be omitted here. In addition, it is preferred to use various kinds of materials generally used as a substrate of the organic EL device of the light-emitting type organic transistor element 20, and for example, materials including flexible materials, hard materials, etc. corresponding to the application will be selected. In detail, for example, substrates including materials, such as glass, quartz, polyethylenes, polypropylenes, polyethylene terephthalates, polymethacrylates, polymethylmethacrylates, polymethyl acrylates, polyesters, and polycarbonates may be mentioned. The shape of the substrate 21 may be sheet-like, or continuous materials may be used, and as detailed shapes, for example, the shape of a card, a film, a disk, a chip, etc. may be mentioned.

Since details of the auxiliary electrode 22 are the same as that of the gate electrode 12 illustrated in FIG. 1A, the description will be omitted here.

FIG. 2B is a process of providing the insulating layer 23 so as to cover the auxiliary electrode 22 on substrate 21. Since details of the insulating layer 23 are the same as that of the insulating layer 13 illustrated in FIG. 1B, the description will be omitted here. Here, on one hand, when the light-emitting type organic transistor element 20 has a bottom emission structure, since this insulating layer 23 is positioned under the light-emitting layer 27, it is preferably transparent or semi-transparent. On the other hand, when it has a top emission structure, it does not need to be transparent or semi-transparent.

FIG. 2C is a process of providing the organic semiconductor layer 24 on the insulating layer 23. The organic semiconductor layer 24 is provided on the insulating layer 13 to work as a charge injecting layer principally in the light-emitting type organic transistor element 20, and therefore it may include a charge injecting substance and a light-emitting material, if needed. Therefore, it is preferred that this organic semiconductor layer 24 is formed at least with materials having a charge injecting function. Examples of the materials include, for example: phenylamine compounds, starburst type amine compounds, phthalocyanine compounds, and polyacene compounds; derivatives, such as polyanilines and polythiophenes; oxides, such as vanadium oxide, molybdenum oxide, ruthenium oxide, and aluminum oxide; amorphous carbon etc. This organic semiconductor layer 24 may have a single layer structure, and may have a laminated structure formed with a plurality of materials. The thickness of the organic semiconductor layer 24 in general is preferably approximately 10 nm to 500 nm.

FIG. 2D is a process of providing the first electrode layer 25 on the organic semiconductor layer 24. The first electrode layer 25 provides the first electrode 25A after patterning, and is provided in layers on the insulating layer 23. Since details of the first electrode layer 25 are the same as that of electrode layer 15 illustrated by FIG. 1D, the description will be omitted here.

Examples of formation materials in a case of using the first electrode 25A as a cathode include metals etc. having a small work function, such as: simple substance metals, such as aluminum and silver; magnesium alloys, such as MgAg; aluminum alloys, such as AlLi, AlCa, and AlMg; alkaline metals including Li and Ca; alloys of alkaline metals, such as LiF. Here, in a case of using the first electrode 25A as an anode, electrode materials similar to those used for the auxiliary electrode 22 or the above-described cathode may be mentioned as formation materials, the material being a metal that forms an ohmic contact with respect to component materials of the organic layer (organic semiconductor layer 24 or light-emitting layer 27) that contacts the anode. Examples preferably include: metals having a large work functions, such as gold and chromium; transparent electric conductive films, such as ITO (indium tin oxide), indium oxide, IZO (indium zinc oxide), $SnO_2$, and ZnO; and conductive polymers, such as derivatives of polyaniline, polyacethylene, and polyalkyl thiophene, and derivatives of polysilane.

Here, when the light-emitting type organic transistor element 20 has a bottom product emission structure, it is preferred that the first electrode 25A positioned beneath (or at the under side of) the light-emitting layer 27 is transparent or semi-transparent. The above-described transparent electric conductive films, metal thin films, and conductive polymer films may be used as the transparent materials. In addition, when Figures illustrated in the present invention are a plane view, the term "beneath," as used herein, will designate an under side in the upper and lower direction.

FIG. 2E is a process of forming the charge injection suppressing layer 26 in a predetermined pattern on the first electrode 25A. This charge injection suppressing layer 26 works as the etching mask 16 in the description of FIG. 1E, and inorganic insulating films and organic insulating films may be mentioned as described above. Since the formation material of the inorganic insulating film or the organic insulating film is the same as those for the above-described etching mask 16, the description will be omitted here.

FIG. 2F is a process of performing wet etching of the first electrode layer 25 into a predetermined pattern. In the same manner as in FIG. 1F, also in this wet etching, the etching solution used for the wet etching includes a dopant for the organic semiconductor layer 24. The wet etching of the first electrode layer 25 using such an etching solution enables patterning of the first electrode 25A above/on the organic semiconductor layer 24 or in a manner of sandwiching the organic semiconductor layer 24. In the present invention, since the etching solution includes the dopant for the organic semiconductor layer 24, in the same manner as that of the above-described organic transistor element in a process of wet etching the electrode into a predetermined pattern, and the dopant is doped to the organic semiconductor layer 24 with concurrent wet etching of the electrode using the etching solution, the following effects may be obtained:

(i) highly accurate and precise pattern formation of electrodes by the wet etching method and high-density integration may be obtained;

(ii) deterioration of the carrier mobility in the organic semiconductor layer may be suppressed or the carrier mobility improves while avoiding the etching damage and the etchant contamination to the organic semiconductor layer; and (iii) simultaneous execution of highly accurate and precise etching of the electrode, and doping into the organic semiconductor layer becomes possible, leading to an operational effect of efficient manufacturing.

The operational effect of the dopant is the same as that described above. On the one hand, it is preferred to oxidize the organic semiconductor layer 14 using a dopant having oxidative capability as the dopant when the first electrode 25A acts as a cathode, in the embodiment illustrated in FIGS. 2A-2H. On the other hand, it is preferred to reduce the organic semiconductor layer 14 using a dopant having reductive capability as the dopant when the first electrode 25A acts as an anode. Here, the kinds of materials similar to those described above may be used as the dopant.

Since the etching solution used and the pattern of the first electrode 25A to be formed by etching are the same as those illustrated in FIG. 1F, the description will be omitted here.

A charge injection suppressing layer 26 having almost the same dimension as that of the first electrode 25A is formed on the first electrode 25A etched in this process. The charge injection suppressing layer 26 works so as to suppress the flow of charge (positive hole or electron, and hereinafter ditto) that has been generated on the upper surface of the first electrode 25A, facing the second electrode 28, and flows to the second electrode 28.

This charge injection suppressing layer 26 is provided at least on the first electrode 25A facing the second electrode 28, and is formed so that the edge part 25a of the first electrode 25A may contact the charge injecting layer 12. In order to satisfy such requirements, it is preferred that the charge injection suppressing layer 26 is provided so that it may have the same dimension on the first electrode 25A in a plan view, and the charge injection suppressing layer 26 may also be provided so as to have a larger dimension than that of the first electrode 25A. An expression of "the same dimension," as used herein, includes a case where the dimension is strictly the same, and it also includes a dimension that demonstrates the same operational effect.

FIG. 2G is a process of providing the light-emitting layer 27 on the charge injection suppressing layer 26 and the organic semiconductor layer 24. The light-emitting layer 27 is a layer that includes at least a light-emitting material and that has a charge transporting material and a charge injecting material, if needed. In the present invention, examples of the configuration of the light-emitting layer 27 include a single layer structure of the light-emitting layer, a two-layered structure consisting of a light-emitting layer and a charge injecting layer, and a three-layered structure consisting of a light-emitting layer, a charge injecting layer, and a charge transporting layer. The light-emitting layer 27 is formed into a suitable thickness (for example, in the range of 0.1 nm to 1 μm) depending on the composition of elements, the kind of component materials, etc. On one hand, an excessive thickness of each layer in the case of the light-emitting layer 27 having a laminated structure needs a higher voltage to be applied for obtaining a constant optical power, and deteriorates luminous efficiency. On the other hand, an excessively small thickness of each layer may generate pinholes etc., and an application of an electric field may not provide sufficient luminance.

Formation materials of the light-emitting layer 27 are not especially limited, as long as they are materials generally used for a light-emitting layer of organic EL devices, and for example, dye based light-emitting materials, metal complex based light-emitting materials, high polymer based light-emitting materials, etc. may be mentioned.

Examples of the dye based light-emitting materials include, for example: cyclopentadiene derivatives, tetraphenyl butadiene derivatives, triphenylamine derivatives, oxadiazole derivatives, pyrazoloquinoline derivatives, distyryl benzene derivatives, distyryl arylene derivatives, silole derivatives, thiophene ring compounds, pyridine ring compounds, perinone derivatives, perylene derivatives, oligo thiophene derivatives, trifumanylamine derivatives, oxadiazole dimer, pyrazoline dimer, etc. Examples of the metal complex based light-emitting materials include, for example: metal complexes having Al, Zn, Be, etc., or rare earth metals, such as Tb, Eu, and Dy as central metal, and oxadiazole, thiadiazole, phenylpyridine, phenylbenzo imidazole, quinoline structures, etc. as ligands, such as aluminum quinolinol complex, benzoquinolinol beryllium complex, benzooxazol zinc complex, benzothiazole zinc complex, azomethylzinc complex, porphyrin zinc complex, ruropium complex etc. Examples of the high polymer based light-emitting material include, for example: poly para-phenylene vinylene derivatives, poly thiophene derivatives, poly para-phenylene derivatives, polysilane derivatives, polyacethylene derivatives, polyvinyl carbazoles, polyfluorenone derivatives, polyfluorene derivatives, polyquinoxaline derivatives, and copolymers thereof.

In order to improve light-emitting efficiency, and to vary light-emitting wavelength, additives such as doping substances may be added in the light-emitting layer 27. Examples of the doping substances include, for example: perylene derivatives, coumarin derivatives, rubrene derivatives, quinacridone derivatives, squalium derivatives, porphyrin derivatives, styryl pigments, tetracene derivatives, pyrazoline derivatives, decacyclene, phenoxazone, quinoxaline derivatives, carbazole derivatives, fluorene derivatives etc.

Examples of the charge injecting material include, for example: phenylamine-, starburst type amine-, phthalocyanine-, polyacene-based compounds; oxides, such as vanadium oxide, molybdenum oxide, ruthenium oxide, and aluminum oxide; derivatives, such as amorphous carbon, poly aniline, and polythiophene, in addition to compounds exemplified as light-emitting materials for the light-emitting layer 27.

Figure 11:
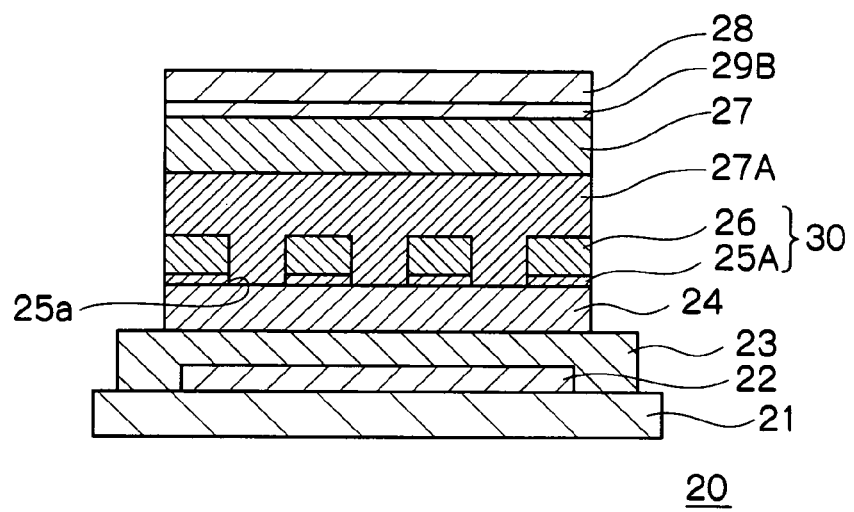
FIG. 11 is a schematic cross section illustrating a light-emitting type organic transistor element of Example 1 and Comparative example 1.

A charge injecting layer for the second electrodes may be provided on a side of the second electrode 28, facing the light-emitting layer 27. For example, the formation materials of a charge (electron) injecting layer in a case of making the second electrode 28 work as a cathode (see notation 29B of FIG. 11) include: alkaline metals and halides of alkaline metals, such as aluminum, lithium fluoride, strontium, magnesium oxide, magnesium fluoride, strontium fluoride, calcium fluoride, barium fluoride, aluminum oxide, strontium oxide, calcium, polymethylmethacrylate sodium polystyrene sulfonate, lithium, cesium, cesium fluoride, in addition to the compounds exemplified for the light-emitting material of the light-emitting layer 27.

Examples of the formation material of a charge (positive hole) transporting layer in a case of making the first electrode 25A work as an anode (see notation 29B in FIG. 11) include: general materials used as hole transporting materials, such as, phthalocyanine, naphthalocyanine, porphyrin, oxadiazole, triphenylamine, triazole, imidazole, imidazolone, pyrazoline, tetrahydro imidazole, hydrazone, stilbene, pentacene, polythiophene butadiene, and derivatives thereof. Furthermore, materials marketed as a formation material of the charge transporting layer, for example, poly(3,4)ethylene dioxythiophene/polystyrene sulfonate (abbreviated as PEDOT/PSS, manufactured by Beyer AG, and trade name; Baytron P A14083, and available as an aqueous solution) etc. may also be used. The charge transporting layer is formed using a coating liquid for charge transporting layer formation containing such compounds. Here, these charge transporting materials may be mixed in the above-described light-emitting layer 27, and may also be mixed in the above-described charge injecting layer.

Here, the charge transporting layer may be provided on a side of the light-emitting layer 27, facing the second electrode 28 (not illustrated). For example, as a formation material of the charge (electron) transporting layer in case of making the second electrode 28 work as a cathode, general materials used as a electron transporting materials, such as, anthraquinodimethane, fluorenylidenemethane, tetracyanoethylene, fluorenone, diphenoquinone oxadiazole, anthrone, thiopyrandioxide, diphenoquinone, benzoquinone, malononitrile, dinitrobenzene, nitroanthraquinone, maleic anhydride, or perylene tetracarboxylic acid, or derivatives etc. thereof may be used. The charge (electron) transporting layer is formed using a coating liquid containing such a compound for the charge transporting layer formation. These charge transporting materials may be mixed in the above-described light-emitting layer 27, and may be mixed in the above-described electron injection layer. Furthermore, the charge transporting layer may be provided on a side of the light-emitting layer 27, facing the first electrode 25A.

Here, the above-described light-emitting layer 27 may include a light-emitting material, or a charge transporting injecting material of an oligomer material or a dendrimer material, if needed. Each layer that forms the organic layer is formed by film formation using a vacuum deposition method, or by coating or printing method, using a coater etc., of the coating liquid prepared by dissolving or dispersing each formation material in solvents, such as toluene, chloroform, dichloromethane, tetrahydrofuran, and dioxane.

According to various kinds of the above-described lamination methods, the light-emitting layer 27 is formed to a predetermined position where the light-emitting layer formation material, the charge injecting layer formation material, the charge transporting layer formation material, etc. are isolated from each other by barrier ribs. Here, the barrier rib (not illustrated) is a mechanism that forms a region isolated for every emitted color on a plane of a light-emitting display device having a light-emitting type organic transistor element. As materials of the barrier rib, various conventional kinds of materials currently used as a materials of the barrier rib, such as photosensitive resins, resins hardened by active-energy-rays, thermosetting resins, thermoplastic resins, etc. may be used. Methods suitable for materials of the barrier rib to be adopted may be used as methods for forming the barrier rib, and for example, a thick film printing method and a patterning method using photosensitive resists may be used.

FIG. 2H is a process of providing the second electrode 28 on the light-emitting layer 27. This second electrode 28 is provided in layers on the light-emitting layer 27. Examples of formation materials in a case of making the second electrode 28 work as a cathode include metals having a small work function, such as: simple substance metals, such as aluminum and silver; magnesium alloys, such as MgAg; aluminum alloys, such as AlLi, AlCa, and AlMg; alkaline metals including Li and Ca; alloys of alkaline metals, such as LiF, as in the description of the first electrode 25A in FIG. 2D, the metals forming an ohmic contact with respect to component materials of the light-emitting layer 27 which the second electrode 28 contacts. Furthermore, examples of formation materials in a case of making the second electrode 28 work as an anode include electrode materials similar to those electrode materials used for the auxiliary electrode 22 or the above-described cathode, and metals forming an ohmic contact with respect to the component materials of the light-emitting layer 27 which the anode contacts. Preferably, the examples include: metal materials having a large work function like gold and chromium; transparent electric conductive films, such as ITO (indium tin oxide), indium oxide, IZO (indium zinc oxide), $SnO_2$, and ZnO; conductive polymers like polyaniline, polyacetylene, polyalkyl thiophene derivatives, and polysilane derivatives.

The second electrode 28 may be an electrode with a single layer structure formed with the above-described electrode material, and may be an electrode in a laminated structure formed with a plurality of electrode materials. The second electrode 28 is formed by vacuum processes, such as vacuum deposition, sputtering, and CVD, or by coating. The thickness is dependent on the material etc. to be used, and for example, it is preferably approximately 10 nm to 1000 nm.

When this organic transistor element has a top emission structure, the second electrode 28 positioned on the upper side of the light-emitting layer 27 is preferably transparent or semi-transparent. As the transparent material, the above-described transparent electric conductive films, metal thin films, and conductive polymer films may be used. An expression "upper side," as used herein, will designate a higher side in the upper and lower direction, when Figures illustrated in the present invention are observed by plane view.

As illustrated in FIG. 2H, the light-emitting type organic transistor element 20 obtained as described above is an organic field effect type light-emitting transistor element having an organic EL device structure and a vertical FET structure, and has the substrate 21; the auxiliary electrode 22 provided on the substrate 21; the insulating layer 23 provided on the auxiliary electrode 22; the organic semiconductor layer 24 provided on the insulating layer 23; the first electrode 25A provided in a predetermined pattern above/on the organic semiconductor layer 24 or in a manner of sandwiching the organic semiconductor layer 24; the charge injection suppressing layer 26 provided with a predetermined dimension on the first electrode 25A; the light-emitting layer 27 provided on the charge injection suppressing layer 26 and the organic semiconductor layer 24; and the second electrode 28 provided on the light-emitting layer 27. The first electrode 25A is provided by etching with an etching solution including the dopant for the organic semiconductor layer 24, and the dopant is doped at least to the surface layer of the organic semiconductor layer 24 concurrently with the etching of the first electrode 25A being performed using the etching solution.

Figure 3:
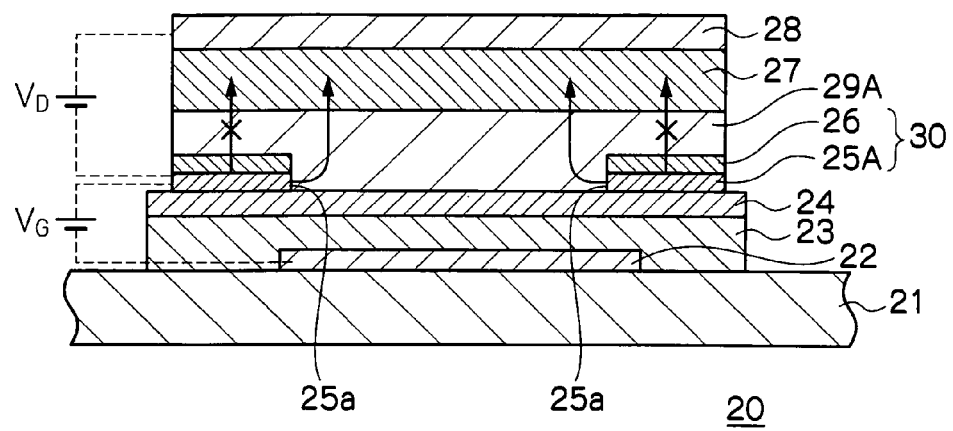
FIG. 3 is a diagram illustrating conceptually a flow of charge in the light-emitting type organic transistor element of FIGS. 2A-2H.

FIG. 3 is a diagram conceptually illustrating a flow of charge in the light-emitting type organic transistor element 20 in FIGS. 2A-2H. The light-emitting type organic transistor element 20 of the present invention has a structure of the edge part 25a of the first electrode 25A contacting a layer (for example, the light-emitting layer 27) having charge injecting function. In detail, as illustrated in FIG. 3, the layer (the light-emitting layer 27) having a charge injecting function and the edge part 25a of the first electrode 25A contact each other, a gate voltage $V_G$ applied between the first electrode 25A and the auxiliary electrode 22 generates a charge (positive hole or electron), and the charge is transported from the first electrode 25A to the second electrode 28 by a drain voltage $V_D$ applied between the first electrode 25A and the second electrode 28. In the present invention, the variation of the gate voltage $V_G$ applied between the auxiliary electrode 22 and the first electrode 25A controls the generated amount of the charge in the case of an application of a constant electric field (drain voltage $V_D$) between the first electrode 25A and the second electrode 28, and as a result the charge is transported to the light-emitting layer 27, and the light emission quantity by recombination with the charge delivered from the second electrode 28 is controlled.

Such control is achieved by disposition of the charge injection suppressing layer 26 on the first electrode 25A, and the flow of the charge that has been generated on the upper surface of the first electrode 25A to the second electrode 28 is suppressed by existence of the charge injection suppressing layer 26, in the case of application of a fixed voltage (drain voltage $V_D$) between the first electrode 25A and the second electrode 28 as illustrated in FIG. 3. As a result, since the charge will be generated in the edge part 25a (end part) with a small area that is not covered by the charge injection suppressing layer 26 and will go to the second electrode 28, the current value between the first electrode and the second electrode may be suppressed in a case of an application of a constant voltage (drain voltage $V_D$) between the first electrode 25A and the second electrode 28. As a result, control of the voltage (gate voltage $V_G$) applied between the auxiliary electrode 22 and the first electrode 25A assists generation of the charge, and thereby the generated amount of the charge in the first electrode 25A can be controlled, leading to control of the light emission quantity. Especially in the present invention, since the function of the dopant raises the carrier density in the organic semiconductor layer 24 and lowers the resistance of the organic semiconductor layer, control of the voltage (gate voltage $V_G$) applied between the auxiliary electrode 22 and the first electrode 25A allows easy assistance of the generation of the charge, leading to easy control of the generated amount of the charge in the first electrode 25A, and of the emission quantity.

[Other Configuration]

In the above-described light-emitting type organic transistor element 20, the first electrode 25A may be used as an anode, and the second electrode 28 may be formed as a cathode. Alternatively, the first electrode 25A may be used as a cathode, and the second electrode 28 may be formed as an anode.

In any case where the first electrode 25A and the second electrode 28 have either polarity, control of a voltage to be applied between the auxiliary electrode 22 and the first electrode 25A can sharply vary the charge quantity, and as a result, it allows control of the electric current flowing between the first electrode and the second electrode, and consequent control of the emission quantity. Here, it is preferred that the positive hole injecting layer 29A (see FIG. 3) is provided so as to contact the first electrode 25A, when the first electrode 25A work as an anode and the second electrode 28 as a cathode. Furthermore, it is preferred that the charge injecting layer is an electron injecting layer 29B (see FIG. 11), when the charge injecting layer is provided on a side that contacts the second electrode 28. Alternatively, it is preferred that an electron injecting layer is provided on a side that contacts the first electrode 25A when the first electrode 25A works as a cathode and the second electrode 28 as an anode. Furthermore, it is preferred that the charge injecting layer is a positive hole injecting layer when the charge injecting layer is provided on the side of the second electrode 28.

Furthermore, on the one hand, dopants having oxidative capability are preferably used when the first electrode 25A works as a cathode, as described above, and on the other hand, dopants having reductive capability are preferably used when the first electrode 25A works as an anode.

Figure 4:
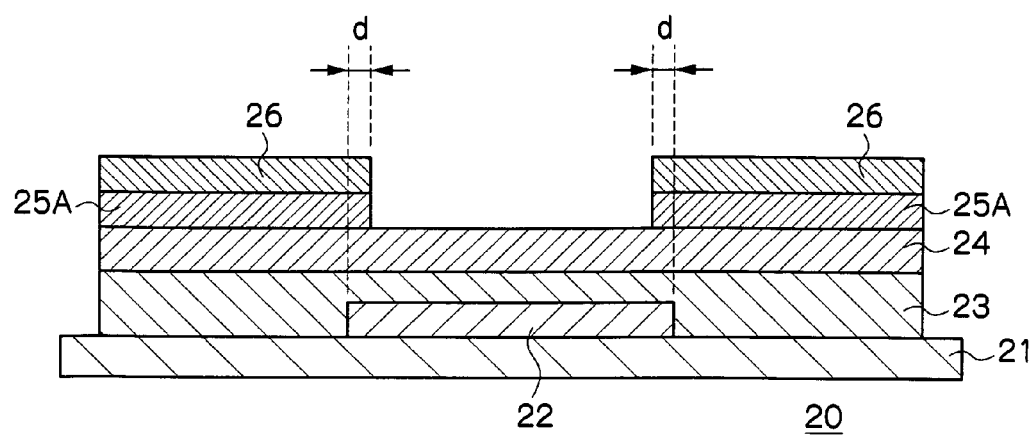
FIG. 4 is a schematic cross section describing the overlap of the auxiliary electrode (gate electrode) and the first electrode (source-drain electrode)

FIG. 4 is a schematic cross section describing an overlap of the auxiliary electrode 22 (gate electrode 12) and the first electrode 25A (source-drain electrodes 15s and 15d). Example of the light-emitting type organic transistor element 20 illustrated in FIGS. 2A-2H will be described. When the organic transistor element 20 is observed in a plan view from the upper side, the auxiliary electrode 22 and the first electrode 25A may be formed so as to have an overlap having a width d. Since such overlap improves a yield rate of the element and provides an effect of improving reproducibility, it is preferred to form a certain dimension of the overlap, as illustrated in FIG. 4. Here, only a part of the overlap may be formed as in FIG. 3, and it is preferred that the first electrode 25A and the auxiliary electrode 22 have a completely overlapped area by formation of the auxiliary electrode 22 providing a wider area.

Figure 5:
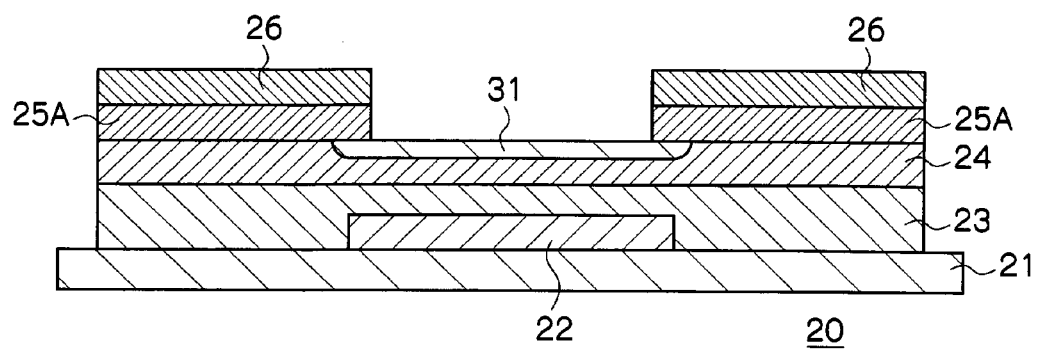
FIG. 5 is a schematic cross section illustrating a region obtained by doping of a dopant in the etching solution into the organic semiconductor layer.

FIG. 5 is a schematic cross section illustrating a region having the dopant in the etching solution doped into the organic semiconductor layer 24. Description will be given using the example of the light-emitting type organic transistor element 20 illustrated in FIGS. 2A-2H. Since the first electrode 25A is provided by etching using the etching solution including the dopant, the first electrode 25A is formed by etching of the first electrode layer 25 using the etching solution, and simultaneously at least the surface layer of the organic semiconductor layer 24 will be a doped region 31 including the doped dopant. Here, the term "at least," as used herein, represents a case where the doped region 31 doped with the dopant is formed from the surface layer of the organic semiconductor layer 14 including the lower part of the first electrode 25A to the vicinity of the interface of the insulating layer 23, in addition to a case where the surface layer as illustrated in FIG. 5 acts as the doped region 31. Since such a doped region 31 is formed in the organic semiconductor layer 24, the obtained organic transistor element provides operational effects as follows:

(i) it has the first electrode 25A (or source-drain electrodes 15s and 15d) with a highly accurate and precise pattern formation, and achieves high-density integration; and (ii) it has the organic semiconductor layer 24 that demonstrates suppressed reduction of carrier mobility, or improved carrier mobility, exhibiting excellent transistor characteristics.

The light-emitting type organic transistor element 20 of the present invention may be a top emission type light-emitting transistor element, and may be a bottom emission type light-emitting transistor element, and the light transmittance of the layers to be formed will be designed by adoption of either form. The cross sectional block diagram of the light-emitting type organic transistor element 20 illustrated in this application illustrates one pixel of a transistor. Therefore, light-emitting display devices, such as color displays, may be obtained by formation of the light-emitting layer that emits light in a predetermined emitted color for every pixel.

[Organic Light-Emitting Transistor and Light-Emitting Display Device]

Hereinafter, the organic light-emitting transistor and light-emitting display device of the present invention will be described, but the present invention is not limited to the following description. The organic light-emitting transistor of the present invention has the light-emitting type organic transistor element 20 of the present invention disposed on a sheet-like substrate in a matrix, comprising: the light-emitting type organic transistor element 20 of the present invention; the first voltage supply device for applying a fixed voltage (drain voltage $V_D$) between the first electrode 25A and the second electrode 28 of the organic transistor element 20; and the second voltage supply device for applying a variable voltage (gate voltage $V_G$) between the first electrode 25A, and auxiliary electrode 22 of the organic transistor element 20.

Figure 6:
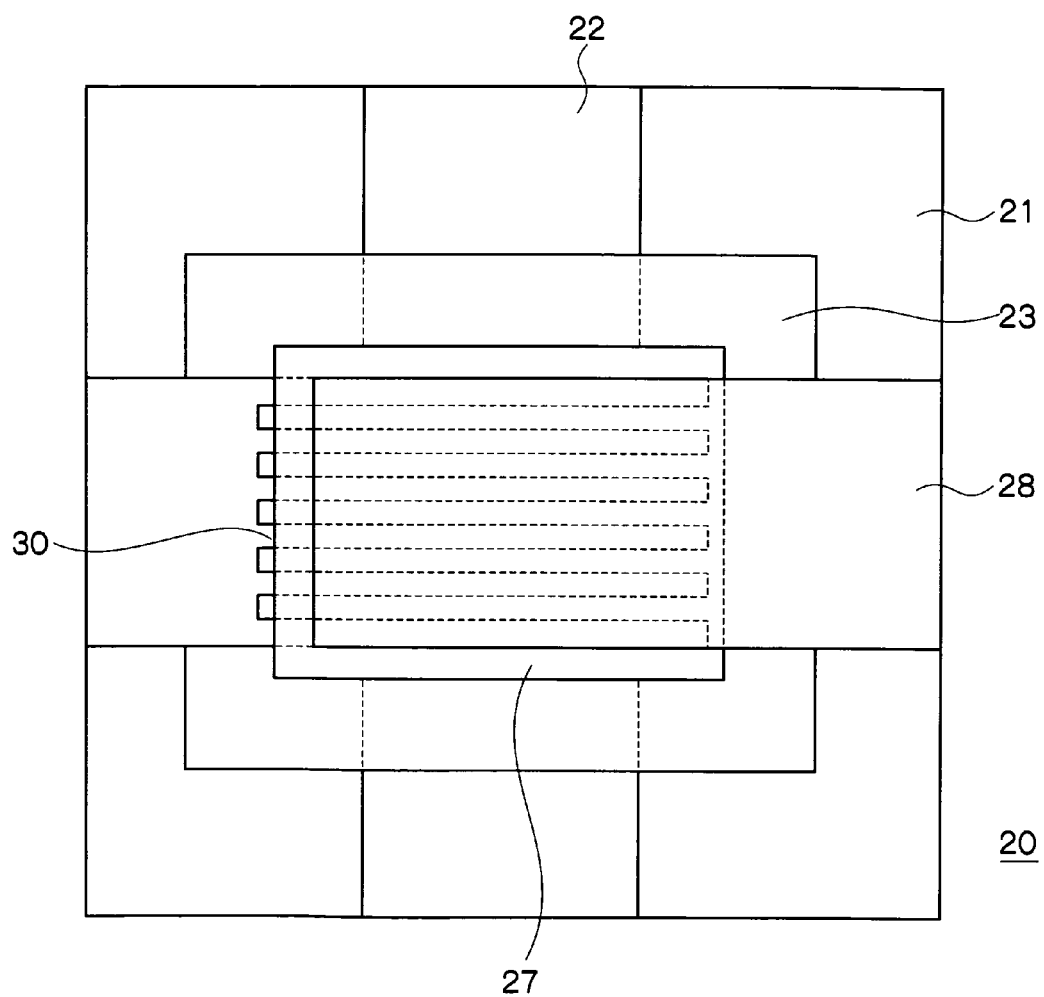
FIG. 6 is a plan view illustrating an example of the electrode disposition for forming the light-emitting type organic transistor element of the present invention.
Figure 7:
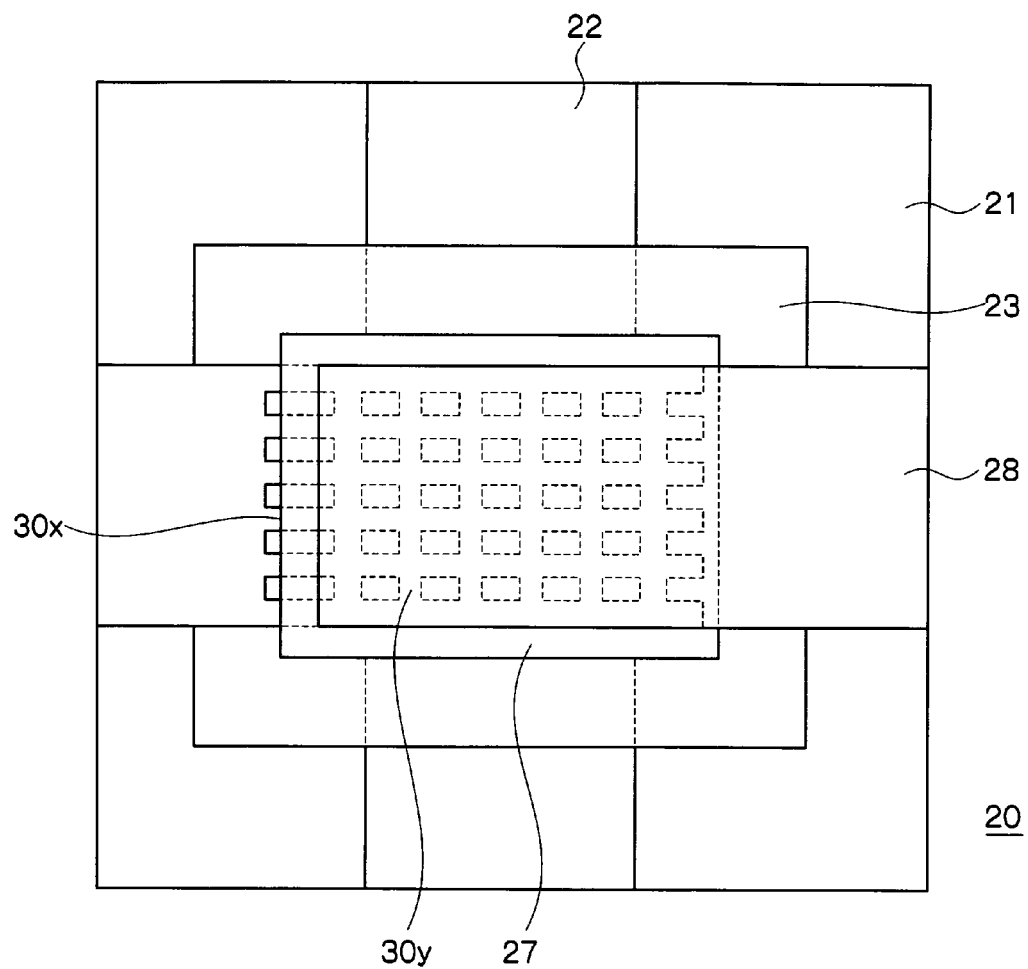
FIG. 7 is a plan view illustrating another example of the electrode disposition for forming the light-emitting type organic transistor element of the present invention.

FIG. 6 and FIG. 7 are plan views illustrating examples of a disposition of an electrode that forms a light-emitting type organic transistor element 20 of the present invention. FIG. 6 is an arrangement in plan view in the case where a laminated structure 30 consisting of the first electrode 25A and the charge injection suppressing layer 26 are formed in a comb-form, and FIG. 7 is an arrangement in plan view in the case where the laminated structures 30 are formed in a grid. As illustrated in FIG. 6 and FIG. 7, the arrangement of the electrode has: an auxiliary electrode 22 extending in an upper and lower direction in a plan view; the laminated structures 30 (the first electrode 25A) extending from one side so as to perpendicularly intersect the auxiliary electrode 22; and the second electrode 28 perpendicularly intersecting the auxiliary electrode 22, the second electrode 28 extending from another side so as to overlap with the laminated structure 30. In FIG. 7, the grid comprises laminated structures 30x in an X direction, and the laminated structures 30y in a Y direction. Here, FIG. 6 and FIG. 7 illustrate examples of the arrangement.

Figure 8:
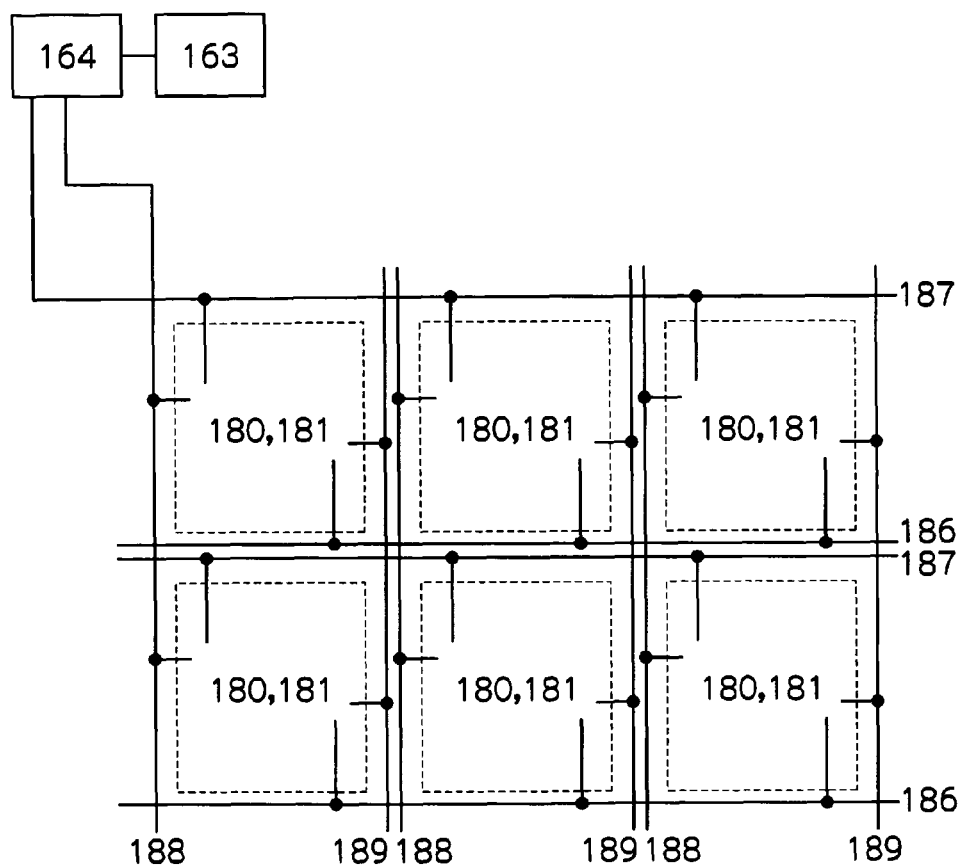
FIG. 8 is a schematic view illustrating an example of a light-emitting display device including the light-emitting type organic transistor element of the present invention.
Figure 9:
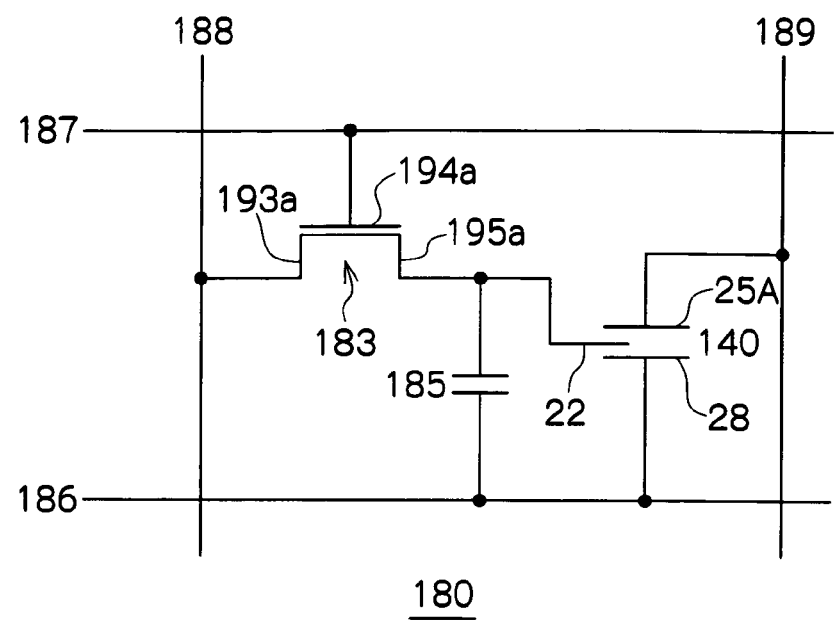
FIG. 9 is a circuit schematic view illustrating an example of an organic light-emitting transistor having the light-emitting type organic transistor element of the present invention provided as each pixel (unit element) in the light-emitting display device.

Furthermore, the light-emitting display device of the present invention is a light-emitting display device having a plurality of light-emitting parts disposed in a matrix, and each of the plurality of light-emitting parts has a light-emitting type organic transistor element 20 of the present invention. FIG. 8 is a schematic view illustrating an example of a typical light-emitting display device including the light-emitting type organic transistor element 20 of the present invention therein. FIG. 9 is a circuit schematic view illustrating an example of organic light-emitting transistors having a light-emitting type organic transistor element 20 of the present invention provided as each pixel (unit element) 180 in a light-emitting display device. This light-emitting display device illustrates an example of each pixel (unit element) 180 having one switching transistor.

Each pixel 180 illustrated in FIG. 9 is connected to the first switching wiring 187 and the second switching wiring 188 that are disposed in vertical and horizontal directions. As illustrated in FIG. 8, the first switching wiring 187 and the second switching wiring 188 are connected to a voltage control circuit 164, and the voltage control circuit 164 is connected to an image signal supply source 163. Here, notation 186 in FIG. 8 and FIG. 9 designates a ground wiring, and notation 189 designates a constant voltage application wiring.

In FIG. 9, a source 193a of the first switching transistors 183 is connected to the second switching wiring 188, a gate 194a is connected to the first switching wiring 187, and a drain 195a is connected to one terminal of the auxiliary electrode 22 of the organic light-emitting transistor 140, and a voltage holding capacitor 185. Furthermore, a terminal of another side of the voltage holding capacitor 185 is connected to the ground 186. The second electrode 28 of the organic light-emitting transistor 140 is connected to the ground 186, and the first electrode 25A of the organic light-emitting transistor 140 is connected to the constant voltage application wiring 189.

Here, operation of the circuit illustrated in FIG. 9 is described. When a voltage is applied to the first switching wiring 187, the voltage will be applied to the gate 194a of the first switching transistors 183. Thereby, conduction is caused between the source 193a and the drain 195a. When a voltage is applied to the second switching wiring 188 in this condition, the voltage is applied to drain 195a and a charge is stored in a voltage holding capacitor 185. Thereby, even though the voltage applied to the first switching wiring 187 or the second switching wiring 188 is turned OFF, the voltage continues being applied to the auxiliary electrode 22 of the organic light-emitting transistor 140 until the charge stored in the voltage holding capacitor 185 is dissipated. Application of a voltage to the first electrode 25A of the organic light-emitting transistor 140 causes conduction between the first electrode 25A and the second electrode 28, and an electric current flows into the ground 186 from the constant voltage supply line 189 through the organic light-emitting transistor 140, resulting in light emission of the organic light-emitting transistor 140.

Figure 10:
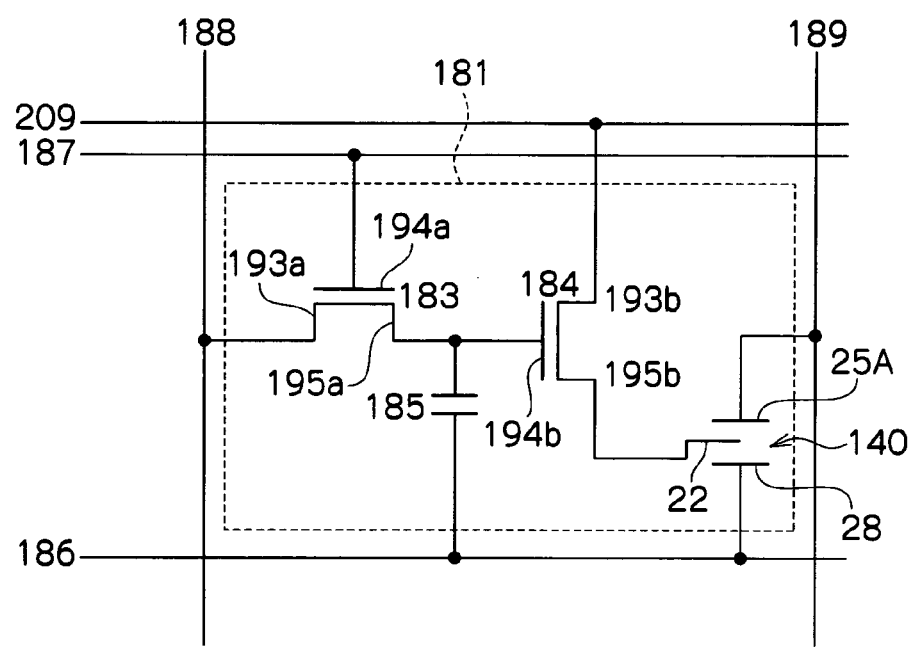
FIG. 10 is a circuit schematic view illustrating another example of an organic light-emitting transistor having the light-emitting type organic transistor element of the present invention provided as each pixel (unit element) in the light-emitting display device.

FIG. 10 is a circuit schematic view illustrating another example of an organic light-emitting transistor having the light-emitting type organic transistor element of the present invention provided as each pixel (unit element) 181 in a light-emitting display device. This light-emitting display device illustrates an example of each pixel (unit element) 181 having two switching transistors.

Each pixel 181 illustrated in FIG. 10, as in case of FIG. 9, is connected to a first switching wiring 187 and a second switching wiring 188 that are disposed in vertical and horizontal directions. As illustrated in FIG. 8, the first switching wiring 187 and the second switching wiring 188 are connected to the voltage control circuit 164, and the voltage control circuit 164 is connected to an image signal supply source 163. Here, notation 186 in FIG. 10 designates a ground wiring, notation 209 designates a current supply source wiring, and notation 189 designates a constant voltage application wiring.

In FIG. 10, a source 193a of a first switching transistor 183 is connected to the second switching wiring 188, a gate 194a is connected to the first switching wiring 187, and a drain 195a is connected to a gate 194b of a second switching transistor 184, and to one terminal of the voltage holding capacitor 185. Furthermore, another terminal of the voltage holding capacitor 185 is connected to the ground 186, the source 193b of the second switching transistors is connected to the current source 191, and the drain 195b is connected to the auxiliary electrode 22 of the organic light-emitting transistor 140. The second electrode 28 of the organic light-emitting transistor 140 is connected to the ground 186, and the first electrode 25A of the organic light-emitting transistor 140 is connected to the constant voltage application wiring 189.

Here, operation of the circuit illustrated in FIG. 10 is described. When a voltage is applied to the first switching wiring 187, a voltage will be applied to the gate 194a of the first switching transistor 183. Thereby, conduction is caused between the source 193a and the drain 195a. In this condition, when a voltage is applied to the second switching wiring 188, the voltage will be applied to the drain 195a and a charge will be stored in the voltage holding capacitor 185. Thereby, even when the voltage applied to the first switching wiring 187 or the second switching wiring 188 is turned OFF, the voltage continues being applied to the gate 194b of the second switching transistor 184 until the charge stored in the voltage holding capacitor 185 is dissipated. Application of the voltage to the gate 194b of the second transistor 184 causes conduction between the source 193b and the drain 195b, and an electric current flows into the ground from the constant voltage application wiring 189 through the organic light-emitting transistor 140, resulting in light emission of the organic light-emitting transistor 140.

The image signal supply source 163 illustrated in FIG. 8, for example, converts electric information provided from devices for reproducing image information currently recorded in an image information media built therein or connected thereto, or from devices for converting inputted electric and magnetic information into an electric information form that can be received by a voltage control apparatus 164, and then sends it to the voltage control apparatus 164. The voltage control apparatus 164 further converts the electric information provided from the image signal supply source 163, calculates the periods of time for either pixel 180,181 to emit light, and it determines a voltage to be applied to the first switching wiring 187 and the second switching wiring 188, a period of time and a timing for application. Thereby, the light-emitting display device can display a desired image based on the image information. Here, an image viewing display in color may be obtained, when the device is configured so that three colors of RGB, that is, red based color, green based color, and blue based color, may be emitted for every minute pixel in mutual proximity.

EXAMPLE

Hereinafter, the present invention will be described further in detail with reference to Examples and Comparative examples.

Example 1

A positive type PVP resist (manufactured by TOKYO OHKA KOGYO CO., LTD., trade name: TMR-P10) was formed into a film with a thickness of 300 nm as an insulating layer 23 by a spin coat method, on a glass substrate 21 with an ITO film having a thickness of 100 nm as the auxiliary electrode 22. Then, Poly3hexylthiophene (manufactured by Sigma-Aldrich Co., trade name: Poly(3-hexylthiophene-2,5-diyl)) as a charge injecting material was applied on the insulating layer 23 by an ink jet method to form an organic semiconductor layer 24 with a thickness of 50 nm as an active layer. Subsequently, an Au layer (30 nm in thickness) as the first electrode layer 25 (anode) was uniformly formed by a vacuum deposition method on this organic semiconductor layer 24. Next, the same PVP resist (manufactured by TOKYO OHKA KOGYO CO., LTD., trade name: TMR-P10), as described above, was applied by a spin coat method. Then, exposure using a mask and development were performed to form a charge (positive hole) injecting suppression layer 26 having a width d1 of 50 μm and a thickness of 300 nm.

In the next step, the first electrode layer 25 was etched to form the first electrode 25A using, as an etching solution, a gold etching solution (manufactured by Kanto Kagaku CO., INC., AURUM 101) containing potassium iodide as an etchant, and iodine as a dopant. Etching was performed so that the edge part 25a of the first electrode 25A might be almost the same as the edge part of the charge injection suppressing layer 26. Next, α-NPD as a charge (positive hole) transporting layer 27A having charge injecting capability and charge transporting capability was applied for film formation by a vacuum deposition method so as to cover the organic semiconductor layer 24 and the charge injection suppressing layer 26, forming a film to give 40 nm of thickness from the upper surface of the charge injection suppressing layer 26. Furthermore, Alq$_3$ (60 nm in thickness) as a light-emitting layer 27/LiF (1 nm in thickness) as an electron injection layer 29B/Al as the second electrode 28 (100 nm in thickness) were laminated in this order by a vacuum deposition, obtaining the light-emitting type organic transistor element of Example 1 having the configuration in FIG. 11.

Figure 12:
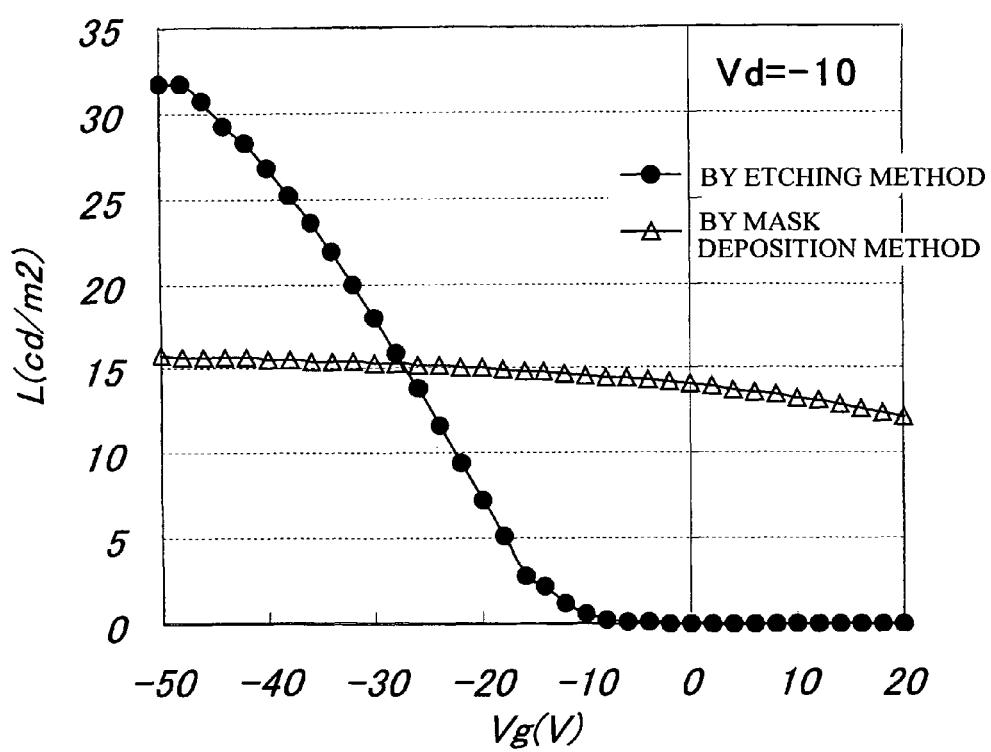
FIG. 12 shows a graph illustrating the variations of luminance obtained by the light-emitting type organic transistor elements of Example 1 and Comparative example 1.
Figure 13:
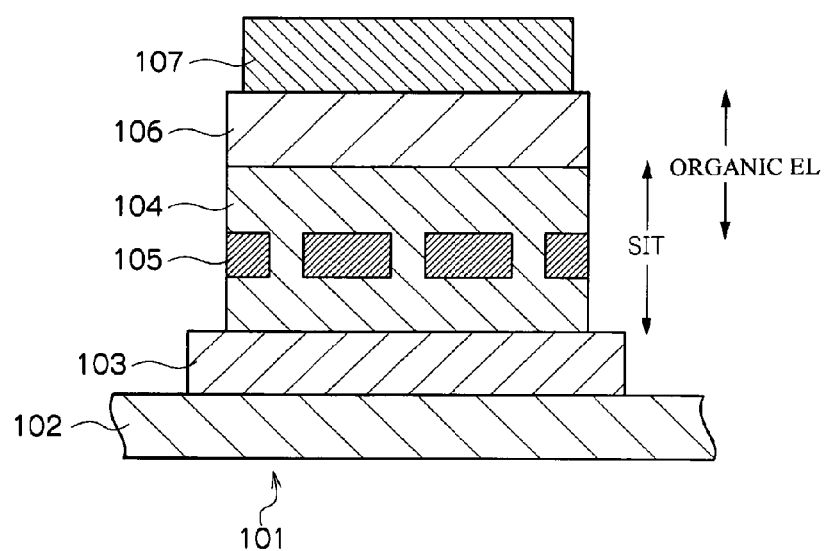
FIG. 13 is a cross section block diagram illustrating an example of a conventional organic light-emitting transistor obtained by combination of an SIT structure and a organic EL device structure.
Figure 14:
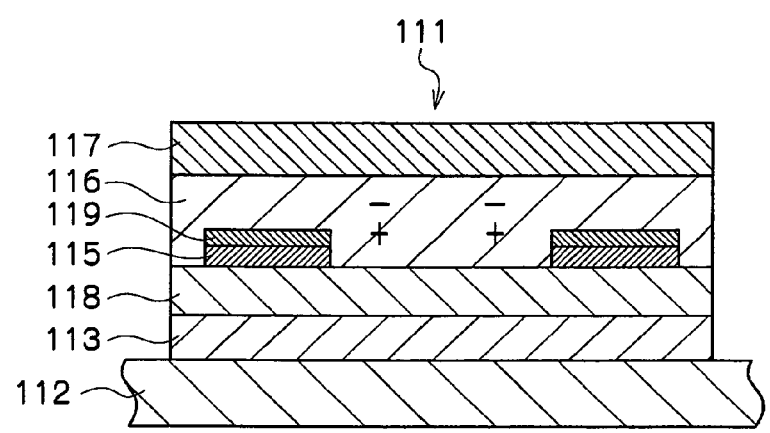
FIG. 14 is a cross section block diagram illustrating another example of a conventional light-emitting transistor obtained by combination of an SIT structure and an organic EL device structure.

The voltage (gate voltage $V_G$) applied between the auxiliary electrode 22 and the first electrode 25A was varied, while applying voltage (drain voltage $V_D$) of minus 10 V between the first electrode 25A of the light-emitting type organic transistor element and the second electrode 28 obtained as described above. FIG. 12 illustrates a graph showing the variation of luminance then obtained. This result shows that at the time of application of the drain voltage $V_D$ of minus 10 V, the variation of the gate voltage $V_G$ was able to set the luminance at about 0 in a range on the plus side from approximately minus 10 V. Such a result indicates that the variation of the gate voltage $V_G$ makes intensity control possible. Here, measurement of the luminance was performed at room temperature and atmospheric condition using a luminance meter (trade name: CS-100A) manufactured by Konica Minolta Holdings, Inc.

The above-described result may be understood as follows. That is, iodine in the etching solution worked as a dopant having oxidative capability with respect to the organic semiconductor layer 24 including thiophene derived high polymer in this Example 1. The first electrode 25A is wet etched using the etching solution, and simultaneously the dopant is doped to the organic semiconductor layer 14. The doped region 31 is a surface layer of the organic semiconductor layer 14, and the doped region 31 can be analyzed by secondary ion mass spectroscopy device (SIMS). In the doped region 31 of this example, iodine as a dopant was identified in a region from the surface layer of the organic semiconductor layer 14 including the region under the first electrode 25A to the vicinity of the interface of the insulating layer. In is this example, the organic semiconductor layer 14 may be oxidized in the doped region 31 to increase positive holes in the organic semiconductor layer 14. Since an increase in such a positive hole leads to an increase of the carrier density of the organic semiconductor layer 14, it reduces resistance, and thereby variation of the gate voltage $V_G$ applied between the auxiliary electrode 22 and the first electrode 25A makes control of movement of carrier possible.

Comparative Example 1

A positive type PVP resist (manufactured by TOKYO OHKA KOGYO CO., LTD., trade name: TMR-P10) was formed into a film with a thickness of 300 nm by a spin coat method as an insulating layer 23, on a glass substrate 21 with ITO film having a thickness of 100 nm as the auxiliary electrode 22. Then, Poly3hexylthiophene (manufactured by Sigma-Aldrich Co., trade name: Poly(3-hexylthiophene-2,5-diyl)) as a charge injecting material was applied on the insulating layer 23 by an ink jet method to form an organic semiconductor layer 24 with a thickness of 50 nm as an active layer. Subsequently, an Au layer (30 nm in thickness) as the first electrode layer 25 (anode) was formed by a vacuum deposition method using a mask on this organic semiconductor layer 24. Next, a positive type PVP resist (manufactured by TOKYO OHKA KOGYO CO., LTD., trade name: TMR-P10) was applied by a spin coat method so as to cover the first electrode 25A. Then, exposure using a mask and development were performed so as to provide the same dimension as that of the first electrode 25A, to form a charge (positive hole) injection suppressing layer 26 having a width d1 of 50 μm and a thickness of 300 nm only on the first electrode 25A.

Next, α-NPD as a charge (positive hole) transporting layer 27A having a charge injecting capability and a charge transporting capability was applied for film formation by a vacuum deposition method so as to cover the organic semiconductor layer 24 and the charge injection suppressing layer 26, forming a film to give a 40 nm of thickness from the upper surface of the charge injection suppressing layer 26. Furthermore, Alq$_3$ (60 nm in thickness) as a light-emitting layer 27/LiF (1 nm in thickness) as an electron injection layer 29B/Al as the second electrode 28 (100 nm in thickness) were laminated in this order by a vacuum deposition, obtaining a light-emitting type organic transistor element of comparative example 1 having the configuration in FIG. 11.

The voltage (gate voltage $V_G$) applied between the auxiliary electrode 22 and the first electrode 25A was varied, while applying a voltage (drain voltage $V_D$) of minus 10V between the first electrode 25A of the light-emitting type organic transistor element and the second electrode 28 obtained as described above. FIG. 12 illustrates a graph showing the variation of luminance then obtained. This result shows that the variation of the gate voltage $V_G$ could not provide ON/OFF control of the luminance, being different from the case in Example 1 at the time of application of the drain voltage $V_D$ of minus 10V. Here, measurement of the luminance was performed by the same method as that in Example 1.

The above-described result may be understood as follows. That is, in this comparative example 2, since an etching solution including a dopant was not used, the organic semiconductor layer 14 was not oxidized by the dopant. Thereby, being different from the case in the Example 1, positive holes of the organic semiconductor layer 14 did not increase in number, and the carrier density was not increased. As a result, control of movement of carriers by variation of the gate voltage $V_G$ applied between the auxiliary electrode 22 and the first electrode 25A was difficult.

DESCRIPTION OF NOTATIONS

10: Organic transistor element
20: Light-emitting type organic transistor element
11, 21: Substrate
12: Gate electrode
13 and 23: Insulating layer
14 and 24: Organic semiconductor layer
15: Electrode layer
15s: Source electrode
15d: Drain electrode 15A: The first electrode
16: Etching mask
22: Auxiliary electrode
25: The first electrode layer
25A: The first electrode
25a: Edge part
26: Charge injection suppression layer
27: Light-emitting layer
27A: Charge (positive hole) transporting layer
28: The second electrode
29A: Charge (positive hole) injection layer
29B: Charge (electron) injection layer
30: Laminated structure
31: Detected doped region
140: Organic transistor
163: Image signal supply source
164: Voltage control circuit
180,181: Pixel
183: First switching transistor
184: Second switching transistor
185: Voltage holding capacitor
186: Ground wiring
187: First switching wiring
188: Second switching wiring
189: Constant voltage application wiring
193a: Source of the first switching transistor
193b: Source of the second switching transistor
194a: Gate of the first switching transistor
194b: Gate of the second switching transistor
195a: Drain of the first switching transistor
195b: Drain of the second switching transistor
209: Current supply source wiring
$V_G$: Gate voltage
$V_D$: Drain voltage

The invention claimed is:

1. A method for manufacturing an organic transistor element having an electrode provided on an organic semiconductor layer comprising:

forming an organic semiconductor layer above an insulating layer;

performing wet etching of the electrode into a predetermined pattern, the electrode being provided on the organic semiconductor layer, the wet etching using an iodine etching solution; and forming a doped region in the organic semiconductor layer from a surface layer of the organic semiconductor layer to a vicinity of an interface of the insulating layer, by doping the dopant into the organic semiconductor layer concurrently with the wet etching of the electrode being performed using the iodine etching solution that includes the dopant, wherein the wet etching includes one of the following:

when the organic semiconductor layer has positive holes as carriers, the dopant in the iodine etching solution is an oxidizing dopant having oxidative capability, wherein the oxidizing dopant is selected from the group consisting of halogens, Lewis acids, proton acids, organic acids, transition metal compounds and electrolytic anions, and the wet etching of the electrode simultaneously oxidizes the organic semiconductor layer and forms more positive holes therein, and when the organic semiconductor layer has electrons as carriers, the dopant in the iodine etching solution is a reducing dopant having reductive capability, wherein the reducing dopant is selected from the group consisting of alkali metals, alkaline earth metals, rare earth metals, ammonium ion, alkyl group including $R_4P^+$, $R_4As^+$, $R_3S^+$ and acetylcholine; and the wet etching of the electrode simultaneously reduces the organic semiconductor layer and forms more electrons therein.

2. A method for manufacturing an organic transistor element, comprising:

preparing a substrate having an auxiliary electrode and an insulating layer provided in this order;

providing an organic semiconductor layer on the insulating layer;

providing a first electrode layer on the organic semiconductor layer;

providing a charge injection suppressing layer with a predetermined dimension on the first electrode layer;

wet etching the first electrode layer using the charge injection suppressing layer as an etching mask to provide a first electrode having a predetermined pattern, the wet etching being carried out using an iodine etching solution containing a dopant;

providing a light emitting layer on the charge injection suppressing layer and the organic semiconductor layer; and providing a second electrode on the light emitting layer, wherein the wet etching forms a doped region in the organic semiconductor layer that extends from a surface layer of the organic semiconductor layer to a vicinity of an interface of the insulating layer, and the wet etching includes one of the following:

when the first electrode is structured as an anode, the dopant in the iodine etching solution is an oxidizing dopant having an oxidative property, the oxidizing dopant is selected from the group consisting of halogens, Lewis acids, proton acids, organic acids, transition metal compounds and electrolytic anions, and the wet etching of the first electrode layer to provide the first electrode simultaneously reduces the organic semiconductor layer and forms the doped region having more positive holes therein, and when the first electrode is structured as a cathode, the dopant in the iodine etching solution is a reducing dopant having a reductive property, the reducing dopant is selected from alkali metals, alkaline earth metal, rare earth metals, ammonium ion, alkyl group including $R_4P^+$, $R_4As^+$, $R_3S^+$, and acetylcholine; and the wet etching of the first electrode layer to provide the first electrode simultaneously reduces the organic semiconductor layer and forms the doped region with more electrons in the organic semiconductor layer.

3. The method for manufacturing the organic transistor element according to claim 1, wherein the organic semiconductor layer is an organic layer including a charge injecting material, a charge transporting material, or a light emitting material.

4. The method for manufacturing the organic transistor element according to claim 1, wherein the organic semiconductor layer is an organic layer including a charge injecting material, a charge transporting material, or a light emitting material.

5. The method for manufacturing the organic transistor element according to claim 1, wherein the oxidizing dopant is selected from the group consisting of the halogens including $Cl_2$, $Br_2$, $I_2$, $ICl$, $ICl_3$, $IBr$ and $IF$; the Lewis acids including $PF_5$, $AsF_5$, $SbF_5$, $BF_3$, $BCl_3$, $BBr_3$ and $SO_3$; the proton acids including $HF$, $FCl$, $HNO_3$, $H_2SO_4$, $HClO_4$, $FSO_3H$, $ClSO_3H$, and $CF_3SO_3H$; the organic acids including acetic acid, formic acid, and amino acid; the transition metal compounds including $FeCl_3$, $FeOCl$, $TiCl_4$, $ZrCl_4$, $HfCl_4$, $NbF_5$, $NbCl_5$, $TaCl_5$, $MoCl_5$, $WF_5$, $WCl_6$, $UF_6$ and $MCl_3$ where M=La, Ce, Nd, Pr or Y; and the electrolytic anions including Cl—, Br—, $PF_6$—, $AsFs_5$-, $SbF_6$—, $BF_4$— and sulfonate anions: and the reducing dopant is selected from the group consisting of the alkali metals including Li, Na, K, Rb and Cs; the alkaline earth metals including Ca, Sr and Ba; and the rare earth metals including of Y, La, Pr, Nd, Sm, Eu, Gd, Tb, Dy, Ho, Er and Yb.

6. The method for manufacturing the organic transistor element according to claim 2, wherein the oxidizing dopant is selected from the group consisting of the halogens including $Cl_2$, $Br_2$, $I_2$, ICl, $ICl_3$, IBr and IF; the Lewis acids including $PF_5$, $AsF_5$, $SbF_5$, $BF_3$, $BCl_3$, $BBr_3$ and $SO_3$; the proton acids including HF, HCl, $HNO_3$, $H_2SO_4$, $HClO_4$, $FSO_3H$, $ClSO_3H$, and $CF_3SO_3H$; the organic acids including acetic acid, formic acid, and amino acid; the transition metal compounds including $FeCl_3$, $FeOCl$, $TiCl_4$, $ZrCl_4$, $HfCl_4$, $NbF_5$, $NbCl_5$, $TaCl_5$, $MoCl_5$, $WF_5$, $WCl_6$, $UF_6$ and $MCl_3$ where M=La, Ce, Nd, Pr or Y; and the electrolytic anions including Cl—, Br—, $PF_6$—, $AsFs_5$-, $SbF_6$—, $BF_4$— and sulfonate anions; and the reducing dopant is selected from the group consisting of the alkali metals including Li, Na, K, Rb, and Cs; the alkaline earth metals including Ca, Sr, and Ba; and the rare earth metals including of Y, La, Pr, Nd, Sm, Eu, Gd, Tb, Dy, Ho, Er, and Yb.

7. An organic transistor element made by the process of claim 1.

8. An organic transistor element made by the process of claim 2.

9. An organic light emitting transistor element having an organic transistor element made by the process of claim 1.

10. An organic light emitting transistor element having an organic transistor element made by the process of claim 2.

11. A light emitting display device having an organic transistor element made by the process of claim 1.

12. A light emitting display device having an organic transistor element made by the process of claim 2.

* * * * *